（12）United States Patent
Josephy et al.

(10) Patent No.: US 7,820,088 B2
(45) Date of Patent: *Oct. 26, 2010

(54) PROCESS FOR MAKING ANGSTROM SCALE AND HIGH ASPECT FUNCTIONAL PLATELETS

(75) Inventors: Karl Josephy, Los Angeles, CA (US); James P. Rettker, Crown Point, IN (US); Howard H. Enlow, Munster, IN (US)

(73) Assignee: Avery Dennison Corporation, Pasadena, CA (US)

( * ) Notice: Subject to any disclaimer, the term of this patent is extended or adjusted under 35 U.S.C. 154(b) by 1527 days.

This patent is subject to a terminal disclaimer.

(21) Appl. No.: 10/758,985

(22) Filed: Jan. 16, 2004

(65) Prior Publication Data

US 2004/0146642 A1  Jul. 29, 2004

Related U.S. Application Data

(60) Division of application No. 09/849,512, filed on May 4, 2001, now Pat. No. 6,863,851, which is a continuation-in-part of application No. 09/425,514, filed on Oct. 22, 1999, now Pat. No. 6,398,999.

(60) Provisional application No. 60/105,399, filed on Oct. 23, 1998.

(51) Int. Cl.
*B29C 69/00* (2006.01)
*B29D 11/00* (2006.01)
(52) U.S. Cl. ............... 264/81; 264/1.1; 264/1.9; 264/140; 264/308; 427/255.6; 427/294
(58) Field of Classification Search ............ 264/81, 264/83, 1.1, 1.9, 140, 308, 2.7, 144, 299, 264/300, 341, 343; 427/255.6, 294, 162; 425/80.1
See application file for complete search history.

(56) References Cited

U.S. PATENT DOCUMENTS 3,123,489 A  3/1964  Bolomey et al.

(Continued)

FOREIGN PATENT DOCUMENTS

DE  198 44 357 C2  3/2000

(Continued)

OTHER PUBLICATIONS

V. Svorcik et al. (1997), *Journal of Materials Science Letters 16*, "Deposition of polystyrene films by vacuum evaporation," pp. 1564-1566.

(Continued)

*Primary Examiner*—Mathieu D. Vargot

(57) ABSTRACT

A process for making functional or decorative flakes or platelets economically and at high production rates comprises applying a multi-layer sandwich of vapor deposited metal and release coats in alternating layers to a rotating chilled drum or suitable carrier medium contained in a vapor deposition chamber. The alternating metallized layers are applied by vapor deposition and the intervening release layers are preferably solvent soluble thermoplastic polymeric materials applied by vapor deposition sources contained in the vapor deposition chamber. The multi-layer sandwich built up in the vacuum chamber is removed from the drum or carrier and treated with a suitable organic solvent to dissolve the release coating from the metal in a stripping process that leaves the metal flakes essentially release coat free. The solvent and dissolved release material are then removed by centrifuging to produce a cake of concentrated flakes which can be air milled and let down in a preferred vehicle and further sized and homogenized for final use in inks, paints or coatings. In one embodiment the finished flakes comprise single-layer thin metal or metal alloy flakes or flakes of inorganic materials, and in another embodiment flakes are coated on both sides with protective polymeric coatings that were applied from suitable vacuum deposition sources or the like contained in the vapor deposition chamber.

11 Claims, 11 Drawing Sheets

U.S. PATENT DOCUMENTS

| | | |
|---|---|---|
| 3,438,796 A | 4/1969 | Hanke |
| 4,100,317 A | 7/1978 | Narui et al. |
| 4,101,698 A | 7/1978 | Dunning et al. |
| 4,116,710 A | 9/1978 | Heikel |
| 4,168,986 A | 9/1979 | Venis, Jr. |
| 4,269,916 A | 5/1981 | Bilofsky et al. |
| 4,321,087 A | 3/1982 | Levine et al. |
| 4,422,915 A | 12/1983 | Wielonski et al. |
| 4,528,235 A | 7/1985 | Sacks et al. |
| 4,543,275 A | 9/1985 | Akashi et al. |
| 4,647,818 A | 3/1987 | Ham |
| 4,682,565 A | 7/1987 | Carrico |
| 4,696,719 A | 9/1987 | Bischoff |
| 4,842,893 A | 6/1989 | Yializis et al. |
| 4,954,371 A | 9/1990 | Yializis |
| 5,018,048 A | 5/1991 | Shaw et al. |
| 5,032,461 A | 7/1991 | Shaw et al. |
| 5,125,138 A | 6/1992 | Shaw et al. |
| 5,135,812 A | 8/1992 | Phillips et al. |
| 5,260,095 A | 11/1993 | Affinito |
| 5,569,535 A | 10/1996 | Phillips et al. |
| 5,643,343 A | 7/1997 | Selifanov et al. |
| 5,795,649 A | 8/1998 | Cosentino et al. |
| 5,811,183 A | 9/1998 | Shaw et al. |
| 5,877,895 A | 3/1999 | Shaw et al. |
| 6,156,379 A | 12/2000 | Terada et al. |
| 6,264,747 B1 | 7/2001 | Shaw et al. |
| 6,270,840 B1 | 8/2001 | Weinert |
| 6,270,841 B1 | 8/2001 | Mikhael et al. |
| 6,398,999 B1 | 6/2002 | Josephy et al. |
| 6,863,851 B2 * | 3/2005 | Josephy et al. ............... 264/81 |

FOREIGN PATENT DOCUMENTS

| | | |
|---|---|---|
| EP | 0 081 599 A1 | 6/1983 |
| EP | 0 227 423 A2 | 7/1987 |
| EP | 0 357 289 A2 | 3/1990 |
| EP | 0 826 745 A2 | 3/1998 |
| EP | 0990715 B1 | 4/2000 |
| GB | 1198044 | 7/1970 |
| GB | 1 520 619 | 8/1978 |
| GB | 1 465 908 | 3/1997 |
| JP | 08283879 | 10/1996 |
| WO | WO 93/23481 | 11/1993 |
| WO | WO 94/16022 A1 | 7/1994 |
| WO | WO 98/24839 | 6/1998 |
| WO | WO 00/18978 | 4/2000 |
| WO | WO 00/24946 | 5/2000 |

OTHER PUBLICATIONS

PCT, International Preliminary Examination Report, dated Jan. 31, 2001, by European Patent Office as International Preliminary Examining Authority, Authorized Officer H. Werner (5 pages).

W.J. Ward, G.L. Gaines, Jr., M.M. Alger and T.J. Stanley, "Gas barrier improvement using vermiculite and mica in polymer films," (1991), pp. 173-180, *Journal of Membrane Science*, 55, Elsevier Science Publishers B.V., Amsterdam.

E.L. Cussler, Stephanie E. Hughes, William J. Ward, III and Rutherford Aris, "Barrier Membranes," (1988), pp. 161-174, *Journal of Membrane Science*, 38, Elsevier Science Publishers B.V., Amsterdam.

F. Carrasco and P. Pages, "Thermogravimetric Analysis of Polystyrene: Influence of Sample Weight and Heating Rate on Thermal and Kinetic Parameters," (1996), pp. 187-197, *Journal of Applied Polymer Science*, vol. 61, John Wiley & Sons, Inc.

Tadahiro Murakata, Manabu Saito, Hiroyasu Sato, Tohru Hirai, Shimio Sato, "Selective Pyrolysis of Polystyrene to That with a Desired Low Polymeric Degree," (1998), pp. 2299-2305, *Journal of Applied Polymer Science*, vol. 70, John Wiley & Sons, Inc.

Fabio Bertini, Guido Audisio, Pier Luigi Beltrame, Laura Bergamasco, Antonella Castelli, "Hydrous Pyrolysis of Silica-Supported Polystyrene," (1998), pp. 2291-2298, *Journal of Applied Polymer Science*, vol. 70, John Wiley & Sons, Inc.

Y.D.M. Simard, M.R. Kamal, and D.G. Cooper, "Thermolysis of Polystyrene," (1995), pp. 843-851, *Journal of Applied Polymer Science*, vol. 58, John Wiley & Sons, Inc.

N. Inagaki, S. Tasaka, and Y. Nozue, "Plasma Polymerization of Metal Acetylacetonates and Application for Gas Sensor Devices," (1992), pp. 1041-1048, *Journal of Applied Polymer Science*, vol. 45, John Wiley & Sons, Inc.

V. Svorcik, V. Rybka, K. Efimenko, and V. Hnatowicz, "Deposition of polystyrene films by vacuum evaporation," (1997), pp. 1564-1566, *Journal of Materials Science Letters* 16, Chapman & Hall.

R.H. Still and A. Whitehead, "Thermal Degradation of Polymers. XV. Vacuum Pyrolysis Studies on Poly (p-methoxystyrene) and Poly (p-hydroxystyrene)," (1977), pp. 1199-1213, *Jounal of Applied Polymer Science*, vol. 21, John Wiley & Sons, Inc.

G.G. Cameron and I.T. McWalter, "On Transfer Reactions During Vacuum Pyrolysis of Polystyrene," (1970), pp. 1601-1603, *European Polymer Journal*, vol. 6, Pergamon Press, England.

D.A. Smith, J.T. Wetzel and A.R. Taranko, "Surface Relief and the Orientation of Vapor Deposited Films," (1985), pp. 77-82, *Mat. Res. Soc. Symp. Proc.*, vol. 37.

H. Haefke and M. Krohn and A. Panov, "The Surface Structure of Vapour- Deposited Films of AgBr and AbCl," (1980), pp. 7-12, *Journal of Crystal Growth* 49, North-Holland Publishing Company.

M. Yandouzi, L. Toth, V. Vasudevan, M Cannaerts, C.Van Haesendonck and D. Schryvers, "Epitaxial Ni-Al thin films on VaCl using a Ag buffer layer," (2000), pp. 719-724, *Philosophical Magazine Letters*, vol. 80, No. 11, Taylor & Francis Ltd.

Giridhar Madras, G.Y. Chung, J.M. Smith, and Benjamin J. McCoy, "Molecular Weight Effect on the Dynamics of Polystyrene Degradation," (1997) pp. 2019-2024, *Ind. Eng. Chem Res.*, vol. 36.

Joseph E. Greene, "Nucleation, Film Growth, and Microstructural Evolution," pp. 681-739, *Deposition Technologies for Films and Coatings*.

English Translation of Opposition Brief filed in the European Patent Office by CIBA Specialty Chemicals Holding Inc. on Sep. 28, 2004, against the European Patent 1131473 B1 (patent in suit); Patentee: Avery Dennison Corporation, 24 pages.

Response by Avery Dennison to European Patent Office Opposition Against EP 1131473, filed Jul. 19, 2005, 29 pages.

Weinert, W., Observation by Third Party Against WO 00/24946 (EP 99953254.2), Applicant: Avery Dennison Corporation, dated May 2, 2002, 3 pgs.

Weinert, W., Observation by Third Party Against WO 00/24946, dated May 25, 2002, 3 pages.

Submission to European Patent Office for EP 99953254.2, Avery Dennison Corporation, dated Jul. 8, 2002, 8 pages.

European Patent Office, Communication Pursuant to Article 96(2)EPC for Application No. 99953254.2-2111; Applicant Avery Dennison Corporation, dated Jul. 12, 2002, 4 pages.
Response to Communication dated Jul. 12, 2002, filed in the European Patent Office for Application No. EP 99953254.2-2111, Applicant Avery Dennison Corporation, dated Oct. 10, 2002, 17 pages.

European Patent Office, Decision to Grant a European Patent Pursuant to Article 97(2) EPC for Application No. EP 99953254.2-2111 1131473, Applicant Avery Dennison Corporation, Dated Nov. 20, 2003.

* cited by examiner

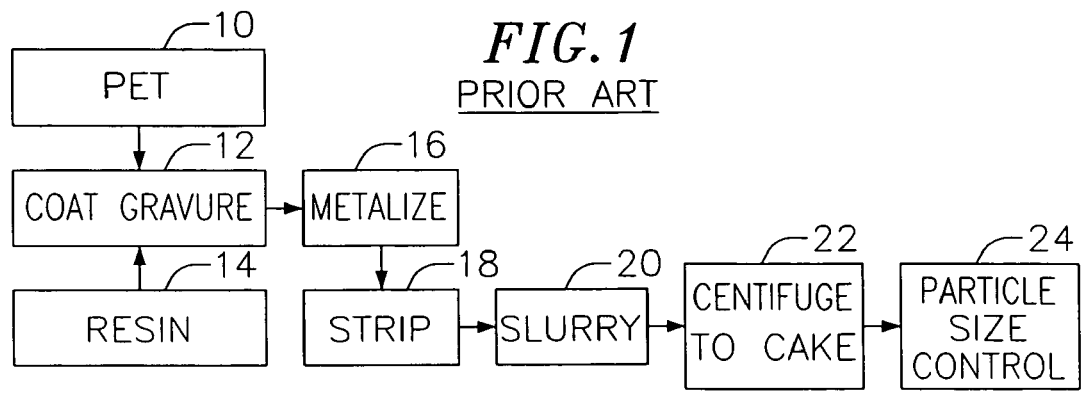
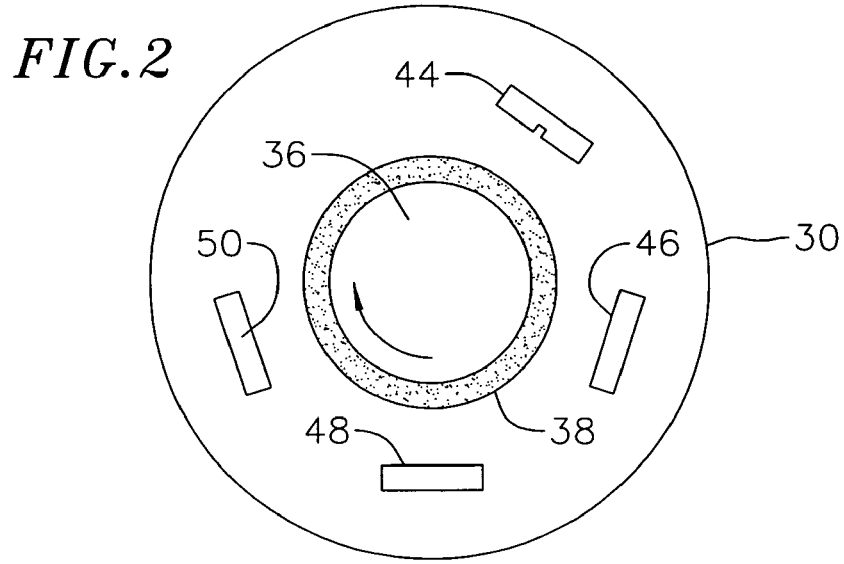
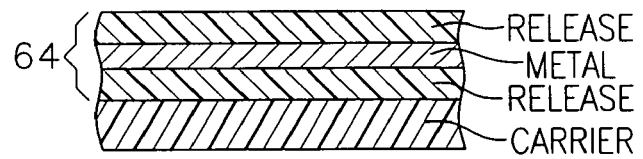
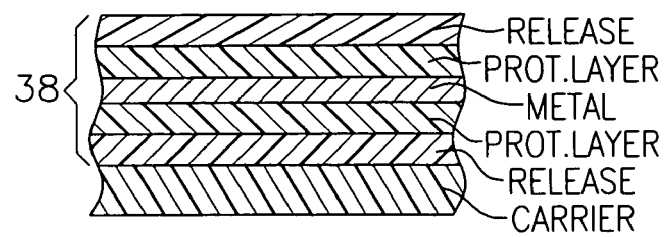

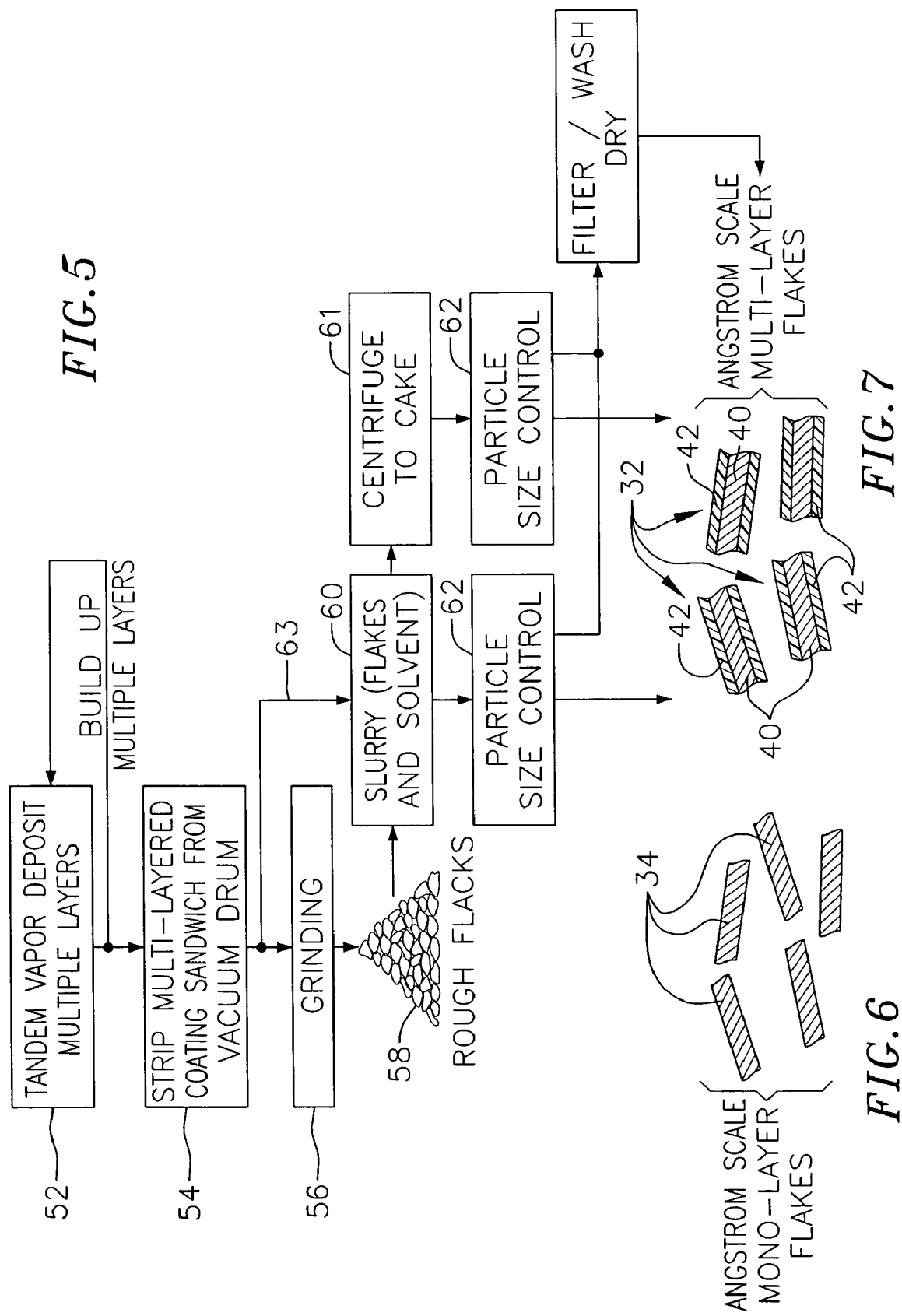

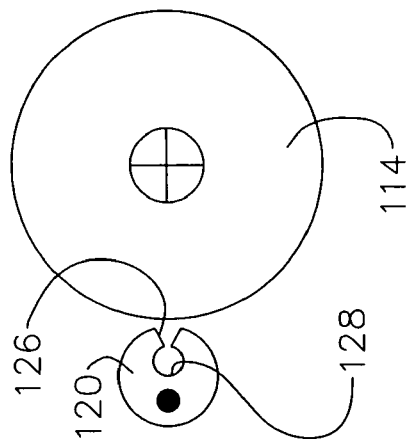
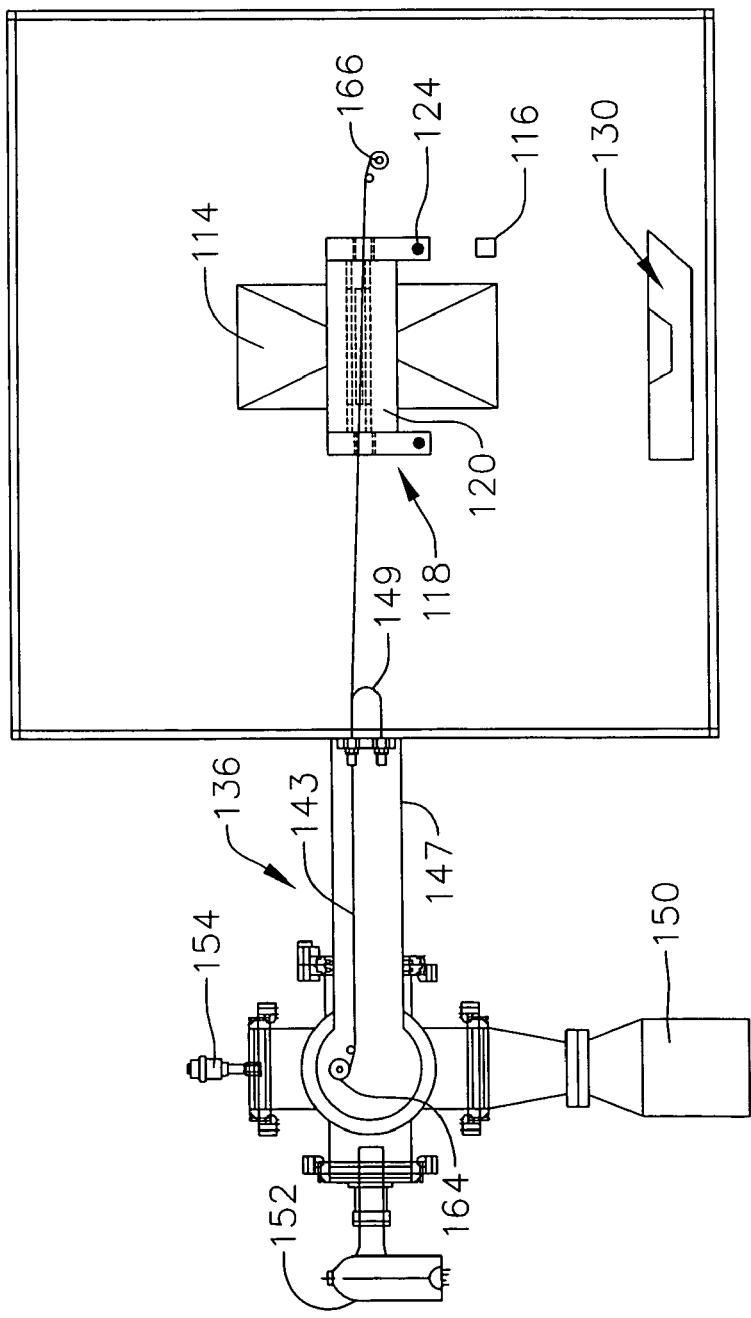

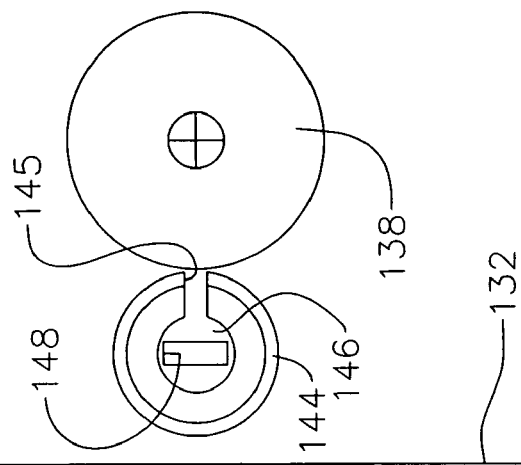
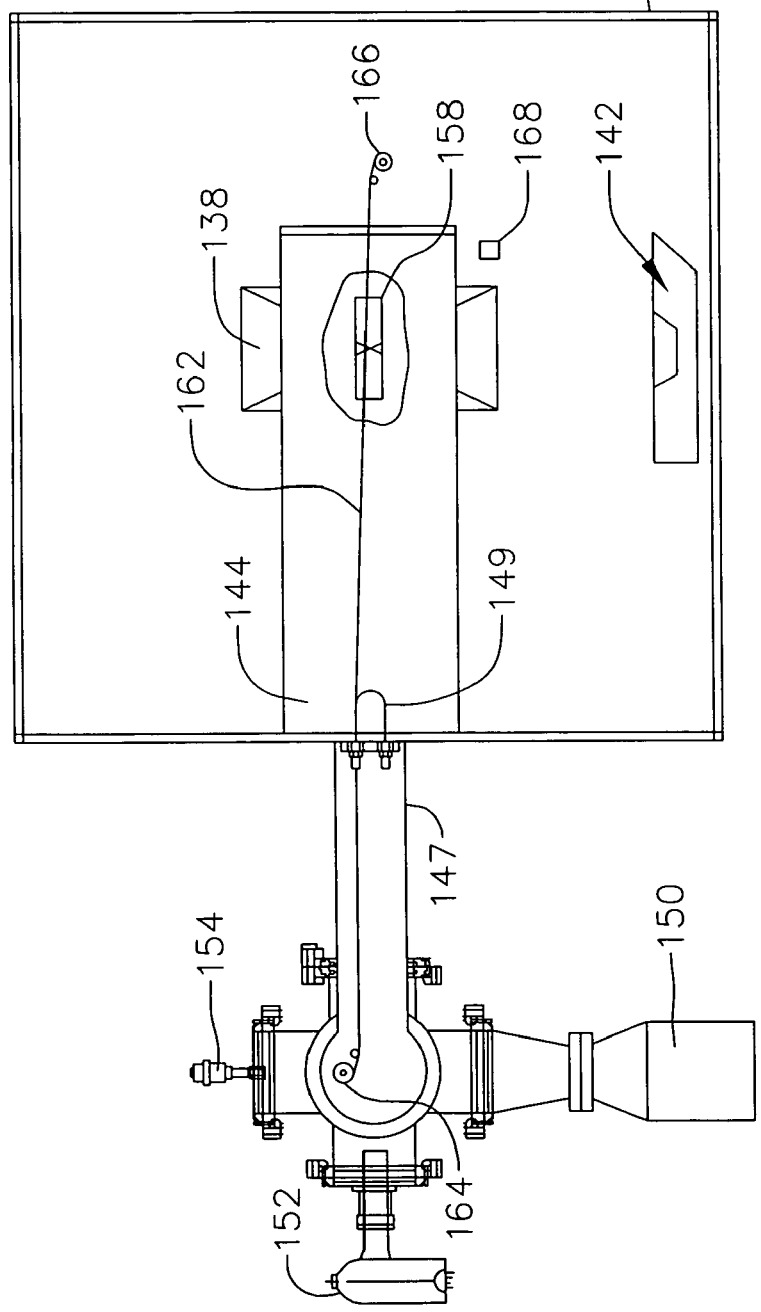
FIG. 16A
FIG. 15A

PROCESS FOR MAKING ANGSTROM SCALE AND HIGH ASPECT FUNCTIONAL PLATELETS

CROSS-REFERENCE TO RELATED APPLICATIONS

This application is a division of application Ser. No. 09/849,512, filed May 4, 2001, now U.S. Pat. No. 6,863,851 which is a continuation-in-part of application Ser. No. 09/425,514, filed Oct. 22, 1999, now U.S. Pat. No. 6,398,999, which claims priority from U.S. Provisional Application No. 60/105,399, filed Oct. 23, 1998.

FIELD OF THE INVENTION

This invention relates to a process for producing angstrom scale flakes or platelets that can be used for both functional and decorative applications. Some flakes produced by this process reach the nanoscale range. The flakes can be metal, metal compounds, non-metal or clear flakes. Functional applications of the flakes include uses in protective coatings in which the flakes can add a level of rigidity to produce certain desired properties of the finished coating, or in which the flake layer can be used to screen out light of certain wave lengths to protect an underlying pigmented layer. Reflective metal flakes are useful in a variety of optical or decorative applications, including inks, paints or coatings. Other uses of the flakes include microwave and electrostatic applications, together with chemical process and biological applications.

BACKGROUND

Conventional aluminum flake is manufactured in a ball mill containing steel balls, aluminum metal, mineral spirits, and a fatty acid usually stearic or oleic. The steel balls flatten the aluminum and break it into flakes. When the ball milling is complete the slurry is passed through a mesh screen for particle sizing. Flakes too large to pass through the screen are returned to the ball mill for further processing. Flake of the proper size is passed through the screen and introduced to a filter press where excess solvent is separated from the flake. The filter cake is then let down with additional solvent. Such conventional aluminum flake typically has a particle size from about 2 to about 200 microns and a particle thickness from about 0.1 to about 2.0 microns. These flakes are characterized by high diffuse reflectance, low specular reflectance, rough irregular flake micro surface, and a relatively low aspect ratio.

Another process for making metal flakes is a process of Avery Dennison Corporation for making flakes sold under the designation Metalure. In this process both sides of a polyester carrier are gravure coated with a solvent-based resin solution. The dried coated web is then transported to a metallizing facility where both sides of the coated sheet are metallized by a thin film of vapor deposited aluminum. The sheet with the thin metal film is then returned to the coating facility where both sides of the aluminum are coated with a second film of the solvent-based resin solution. The dried coated/metal sheet is then transported again to the metallizing facility to apply a second film of vapor deposited aluminum to both sides of the sheet. The resulting multilayer sheet is then transported for further processing to a facility where the coatings are stripped from the carrier in a solvent such as acetone. The stripping operation breaks the continuous layer into particles contained in a slurry. The solvent dissolves the polymer out from between the metal layers in the slurry. The slurry is then subjected to sonic treatment and centrifuging to remove the solvent and the dissolved coating, leaving a cake of concentrated aluminum flakes approximately 65% solids. The cake is then let down in a suitable vehicle and further sized by homogenizing into flakes of controlled size for use in inks, paints, and coatings. Metal flakes produced by this process for use in printable applications such as inks are characterized by a particle size from about 4 to 12 microns and a thickness from about 150 to about 250 angstroms. Coatings made from these flakes have a high specular reflectance and a low diffuse reflectance. The flakes have a smooth mirror-like surface and a high aspect ratio. The coatings also have a high level of coverage per pound of flake applied when compared with metal flakes produced by other processes.

Flakes also are produced in a polymer/metal vacuum deposition process in which thin layers of vapor deposited aluminum are formed on a thin plastic carrier sheet such as polyester or polypropylene, with intervening layers of crosslinked polymers between the vapor deposited aluminum layers. The cross-linked polymer layers are typically a polymerized acrylate deposited in the form of a vaporized acrylate monomer. The multi-layer sheet material is ground into multilayer flakes useful for their optical properties. Coatings produced from such multi-layer flakes tend to have a high diffuse reflectance and a low specular reflectance. The flakes have a low aspect ratio and undesired low opacity when made into an ink.

One objective of the present invention is to reduce the number of manufacturing steps and the resulting cost of making highly reflective metal flakes, although the process also reduces the coast of making other flake-like materials described below.

In addition to metal flakes, there are many industrial uses of glass ($SiO_2$) flakes. Conventional glass flakes generally have a thickness range of about one to six microns and a diameter from about 30 to about 100 microns. These glass flakes can be used for additions to polymers and coatings to improve various functional properties. These include addition of glass flakes as additives to produce thinner, smoother coatings, for example. One objective of this invention is to produce very thin, flat, smooth flakes, such as metal or glass flakes, for example, for use of their various functional properties in polymers, coatings and films.

SUMMARY OF THE INVENTION

The present invention comprises a flake forming process in which a multi-layer film is applied either to a thin, flexible polymeric carrier sheet such as polyester, or to a polished metal casting surface such as a rotating metal drum. In either instance the process is carried out in a vacuum deposition chamber. In one embodiment, the multi-layer film is applied to a polyester (PET) carrier sheet. The vacuum chamber is equipped with multiple deposition sources. The deposition sources can be vaporization at elevated temperatures caused by heating by resistance or EB. Air is evacuated from the chamber and the PET film is unwound past the coating and deposition sources while kept in contact with a cooling drum. Alternating layers of materials can be applied to the moving PET web. One example is an organic solvent-soluble vapor deposited thermoplastic polymeric release material (having a deposition thickness of about 100 to about 400 angstroms), followed by a layer of metal such as aluminum (having a deposition thickness of about 5 to about 500 angstroms), followed by another layer of the solvent-soluble release material. Other metals, metal alloys, or inorganic compounds for making glass flakes, for example, may be substituted for the aluminum. By reversing the web path and inactivating the second coating source and then repeating the first step, many layers can be applied to the PET without breaking the vacuum, which can increase productivity. Additional protective layers can be deposited on each side of the metal layers by adding two additional deposition sources between the coating and metal deposition sources. The multi-layered coated PET is introduced into an organic solvent stripping process to remove the sandwich from the PET. The polymeric release coat material is dissolved by the organic solvent to leave the deposited flake material essentially free of the release material. The solvent is then centrifuged to produce a cake of concentrated flakes.

In an alternative embodiment, the same coating and deposition techniques are used to apply alternating layers directly to a release coated cooling drum contained in the vacuum deposition chamber. The drum is rotated past the coating and deposition sources to build up a multi-layer sandwich of vapor deposited thermoplastic release material and flake material in alternating layers. The multi-layer sheet is then introduced directly into an organic solvent with or without suitable agitation to produce flakes; or it can be ground to rough flakes which can also be air-milled to further reduce particle size, and then introduced into a solvent slurry to allow the remaining layers to be separated. The solvent may be removed by centrifuging to produce a cake of concentrated metal flakes, essentially free of any release material. The cake of concentrated flakes or the slurry of solvent and flakes then can be let down in a preferred vehicle and further sized and homogenized for final use in inks, paints, plastics or coatings.

Another embodiment of the invention comprises a process for making a release-coated heat-resistant polymeric carrier sheet in the vacuum deposition chamber. The carrier sheet can comprise a web of polyester (PET) as described above. The release coat comprises an organic solvent soluable thermoplastic polymeric material vapor deposited on the polyester carrier. The release-coated carrier provides a flexible smooth surfaced carrier base upon which to vapor deposit flake materials such as metal or glass to provide an effective release surface for making angstrom scale flakes. The flakes are exceedingly thin and flat when released from the thermoplastic release coat via a suitable organic solvent.

Other embodiments of the invention comprise techniques for controlling delivery of the vapor deposited thermoplastic polymeric release coat material to the vacuum chamber. These include a rotating drum, heater block and E-beam embodiment; several embodiments comprise a wire feed mechanism used to coat the polymer on a wire which is fed into the vacuum chamber and heated to evaporate the polymer and deposit it on a rotating drum or other carrier surface.

Further embodiments comprise applications of the angstrom scale particles made by this invention which include flakes used to control water vapor transmission rates in barrier materials and electrical applications in which the angstrom scale flakes can be used to produce constructions having exceedingly high electrical capacitance.

These and other aspects of the invention will be more fully understood by referring to the following detailed description and the accompanying drawings.

DRAWINGS

FIG. 1 is a schematic functional block diagram illustrating a prior art process for manufacturing metal flakes.

FIG. 2 is a schematic elevational view illustrating a vacuum deposition chamber for applying a multi-layer coating in a first embodiment of a process according to this invention.

FIG. 3 is a schematic cross-sectional view illustrating a sequence of layers in one embodiment of the multi-layer sheet material according to this invention.

FIG. 4 is a schematic cross-sectional view illustrating a multi-layer sheet material made according to another embodiment of this invention.

FIG. 5 is a functional block diagram schematically illustrating processing steps in the first embodiment of this invention.

FIG. 6 is a schematic cross-sectional view illustrating single layer flakes made by the process of this invention.

FIG. 7 is a schematic cross-sectional view of multi-layer flakes made by the process of this invention.

FIG. 13 is a semi-schematic side elevational view showing vacuum chamber and heater block assembly similar to FIGS. 11 and 12 in combination with a wire feed apparatus for delivering polymeric release coat material to a rotating drum surface in the vacuum chamber.

FIG. 14 is a side elevational view of the rotating drum and heater block assembly illustrated in FIG. 13.

FIGS. 15A and 16A are alternative embodiments of the wire feed mechanism shown in FIGS. 15 and 16;

DETAILED DESCRIPTION

Figure 8:
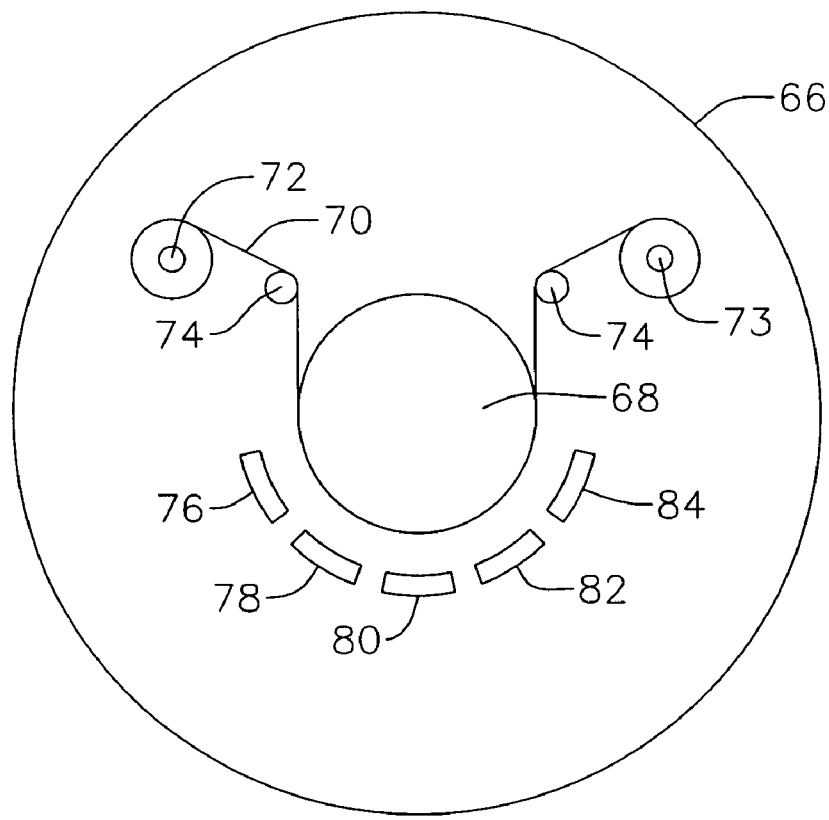
FIG. 8 is a schematic elevational view illustrating a second embodiment for producing the metal flakes of this invention.

In order to better appreciate certain aspects of this invention, reference is made to FIG. 1 which illustrates a prior art process for making metal flakes according to a process presently utilized by Avery Dennison Corporation for manufacturing flakes sold under the designation Metalure. According to this prior art process, both sides of a polyester carrier sheet 10 are gravure coated at 12 with a solvent-based resin solution 14. The dried coated web is then transported to a metallizing facility 16 where both sides of the coated and dried carrier sheet are metallized with a thin film of vapor deposited aluminum. The resulting multi-layer sheet is then transported for further processing to a facility at 18 where the coatings are stripped from the carrier in a solvent such as acetone to form a solvent-based slurry 20 that dissolves the coating from the flakes. The slurry is then subjected to sonic treatment and centrifuging to remove the acetone and dissolved coating, leaving a cake 22 of concentrated aluminum flakes. The flakes are then let down in a solvent and subjected to particle size control at 24 such as by homogenizing.

This process has proved highly successful in producing extremely thin metal flakes of high aspect ratio and high specular reflectance. (Aspect ratio is the ratio of average particle size divided by average particle thickness.) Despite the success of the Metalure process, it would be desirable to reduce production costs because the repeated transportation of the coated web between gravure coating and metallizing facilities increases the cost of production. There is also a production cost associated with the PET carrier not being reusable after the stripping operations.

FIGS. 2 to 5 illustrate one embodiment of a process for making the metal flakes shown in FIGS. 6 and 7. This process also can be used for making glass flakes, described below, and also can be used for making nanospheres, as described below. FIG. 2 illustrates a vacuum deposition chamber 30 which contains suitable coating and metallizing equipment for making the multi-layer coated flakes 32 of FIG. 7. Alternatively, certain coating equipment in the vacuum chamber of FIG. 2 can be deactivated for making the single layer flakes 34 of FIG. 6, as will become apparent from the description to follow.

Referring again to FIG. 2, the vacuum deposition chamber 30 includes a vacuum source (not shown) used conventionally for evacuating such deposition chambers. Preferably, the vacuum chamber also will include an auxiliary turbo pump (not shown) for holding the vacuum at necessary levels within the chamber without breaking the vacuum. The chamber also includes a chilled polished metal drum 36 on which a multi-layer sandwich 38 is produced. This embodiment of the invention will first be described with reference to making the flakes 32 of FIG. 7 which, in one embodiment, includes an internal metallized film layer 40 and outer layers 42 of a protective coating bonded to both sides of the metal film. The protective coating can comprise an inorganic material or a polymeric material, both of which are vapor deposited under vacuum.

The vacuum deposition chamber includes suitable coating and vapor deposition sources circumferentially spaced apart around the drum for applying to the drum a solvent soluble or dissolvable release coating, a protective outer coating, a metal layer, a further protective outer coating for the metal layer, and a further release layer, in that order. More specifically, these sources of coating and deposition equipment contained within the vacuum deposition chamber include (with reference to FIG. 2) a release system source 44, a first protective coating source 46, a metallizing source 48, and a second protective coating source 50. These coating and/or deposition sources are spaced circumferentially around the rotating drum so that as the drum rotates, thin layers can be built up to form the multi-layered coating sandwich 36 such as, for example, in sequence: release-coating-metal-coating-release-coating-metal-coating-release, and so on. This sequence of layers built up in the multi-layer sandwich 38 is illustrated schematically in FIG. 4 which also illustrates the drum 36 as the carrier in that instance.

In one embodiment, the release coating is either solvent-soluble or dissolvable but is capable of being laid down as a smooth uniform barrier layer that separates the metal or glass flake layers from each other, provides a smooth surface for depositing the intervening metal or glass flake layers, and can be separated such as by dissolving it when later separating the metal or glass flake layers from each other. The release coating is a dissolvable thermoplastic polymeric material having a glass transition temperature ($T_g$) or resistance to melting that is sufficiently high so that the heat of condensation of the deposited metal layer (or other flake layer) will not melt the previously deposited release layer. The release coating must withstand the ambient heat within the vacuum chamber in addition to the heat of condensation of the vaporized metal or glass flake layer. The release coating is applied in layers to interleave various materials and stacks of materials so as to allow them to be later separated by solubilizing the release layer. A release layer as thin as possible is desired because it is easier to dissolve and leaves less residue in the final product. Compatibility with various printing and paint systems also is desirable. The release coating is solvent-soluble, preferably a thermoplastic polymer, which is dissolvable in an organic solvent. Although the release coating source 44 can comprise suitable coating equipment for applying the polymeric material as a hot melt layer or for extruding the release coat polymer directly onto the drum, in the preferred embodiment, the release coat equipment comprises a vapor deposition source that vaporizes a suitable monomer or polymer and deposits it on the drum or sandwich layer. Various examples of vapor deposition equipment for applying the polymeric release coat to the deposition surface are described below. The release material freezes to solidify when it contacts either the chilled drum or the multi-layer sandwich previously built up on the chilled drum. The multi-layer film built up on the drum has a thickness sufficient to enable the chilled drum to pull enough heat through the film so as to be effective in solidifying the release coat being deposited on the outer surface of the metal or glass flake layer. An alternative polymeric release coating material can be lightly cross-linked polymeric coatings which, while not soluble, will swell in a suitable solvent and separate from the metal or glass flake material. In addition, a dissolvable release material may comprise a polymeric material which has been polymerized by chain extension rather than by cross-linking.

Presently preferred polymeric release coatings are styrene polymers, acrylic resins or blends thereof. Cellulosics may be suitable release materials, if capable of being coated or evaporated without detrimentally affecting the release properties.

Presently preferred organic solvents for dissolving the polymeric release layer include acetone, ethyl acetate and toluene.

Referring again to the process of making the flakes shown in FIG. 2, and following application of the release coating, the drum travels past the first protective coating source 46 for applying a protective layer to the release coat. This protective layer can be a vapor deposited functional monomer such as an acrylate or methacrylate material which is then cured by EB radiation or the like for cross-linking or polymerizing the coating material; or the protective material can be a thin layer of radiation cured polymer which can be later broken up into flakes. Alternatively, the protective layer can be a vapor deposited inert, insoluble inorganic or glass flake material which forms a hard clear coat that bonds to both sides of the metal layer. Desirable protective coatings are hard impervious materials which can be deposited in alternating layers with metals such as aluminum to provide a level of wear resistance, weatherability protection, and water and acid resistance. Examples of such protective materials are described below.

The rotating drum then transports the coating past the metallizing source 48 for vapor depositing a layer of metal such as aluminum on the coating layer. A number of metals or inorganic compounds can be deposited as a thin film interleaved by other materials and release layers so they can be later separated into thin metallic flakes. In addition to aluminum, such materials include copper, silver, chromium, nichrome, tin, zinc, indium, and zinc sulfide. Metal coatings also can include multi-directional reflection enhancing stacks (layers of highly reflective materials), or optical filters made by depositing suitable layers of controlled thickness and index of refraction.

The rotating drum then transports the stack past the second coating source 50 for again applying a similar protective coating layer to the metallized film such as by vapor deposition and curing of a hard protective polymeric material or vapor depositing an inorganic material.

Rotation of the drum then transports the sandwich material full circle again past the release coat source and so on in sequence to build up the coated metal layers.

Inorganic materials such as oxides and fluorides also can be vapor deposited by the deposition source 48 so as to produce thin layers that can be separated and made into flakes. Such coatings include magnesium fluoride, silicon monoxide, silicon dioxide, aluminum oxide, aluminum fluoride, indium tin oxide and titanium dioxide.

Suitable deposition sources include EB, resistance, sputtering and plasma deposition techniques for vapor depositing thin coatings of metals, inorganics, glass flake material and polymers.

Once the multi-layer sandwich is produced in the vacuum deposition chamber, it is then ready to be removed from the drum and subjected to further processing illustrated in FIG. 5.

The continuous process of building up the multi-layer sandwich is depicted at FIG. 52 in FIG. 5. The multi-layer sandwich is then stripped from the drum at 54 by a process in which the layers that are separated by the releasing material are broken apart into individual layers. The sandwich layers may be stripped by introducing them directly into an organic solvent, or by crushing and grinding or scraping. In the illustrated embodiment, the multi-layer sandwich is subjected to grinding at 56 to produce rough flakes 58. The rough flakes are then mixed with a suitable solvent in a slurry 60 for dissolving the release coat material from the surfaces of the multi-layer flakes 32. Alternatively, the multi-layer sandwich may be stripped from the drum and broken into individual layers by a step 63 of introducing the layered material directly into the solvent at 60. The release coat material applied in the vacuum deposition chamber is selected so that the release material is dissolvable from the flakes by the solvent in the slurry process. In one embodiment, the slurry is subjected to a centrifuging step 61 so that the solvent or water is removed to produce a cake of concentrated flakes. The cake of concentrated flakes then can be let down in a preferred vehicle, in a particle size control step 62, to be further sized and homogenized for final use of the flakes in inks, paints or coatings, for example. Alternatively, the flakes can be let down in a solvent (without centrifuging) and subjected to particle size control at 62.

As an alternative processing technique, the multi-layer sandwich can be removed from the drum and "air" milled (inert gas should be used to prevent fire or explosion) or otherwise reduced to a small particle size, followed by treating this material in a two-step solvent process. First a small amount of solvent is used to begin the swelling process in dissolving the release coat layers. A different second solvent is then added as a finished solvent for completing the release coat dissolving process and for enhancing compatibility with the finished ink or coating. This process avoids subsequent centrifuging and homogenization steps.

In an alternative embodiment for utilizing the vacuum chamber 30 equipment of FIG. 2 the protective coating sources 46 and 50 can be omitted and the process can be used for making the single layer flakes 34 shown in FIG. 6. In this instance the build up of layers on the drum 36 to form the multi-layer sandwich 38 comprises successive layers of release-metal-release-metal-release, and so on, as illustrated at 64 in FIG. 3. Alternatively, the single layer flakes can comprise layers of an inorganic or glass flake material as described above.

Many different materials and stacks of materials can be constructed where they are sandwiched by the soluble release layers that allow them to be separated from each other by solubilizing the release material. Examples of such constructions are: (1) release/metal/release; (2) release/protective layer/metal/protective layer/release; (3) release/nonmetal layer/release; and (4) release/multidirectional reflection enhancing stack/release.

Figure 9:
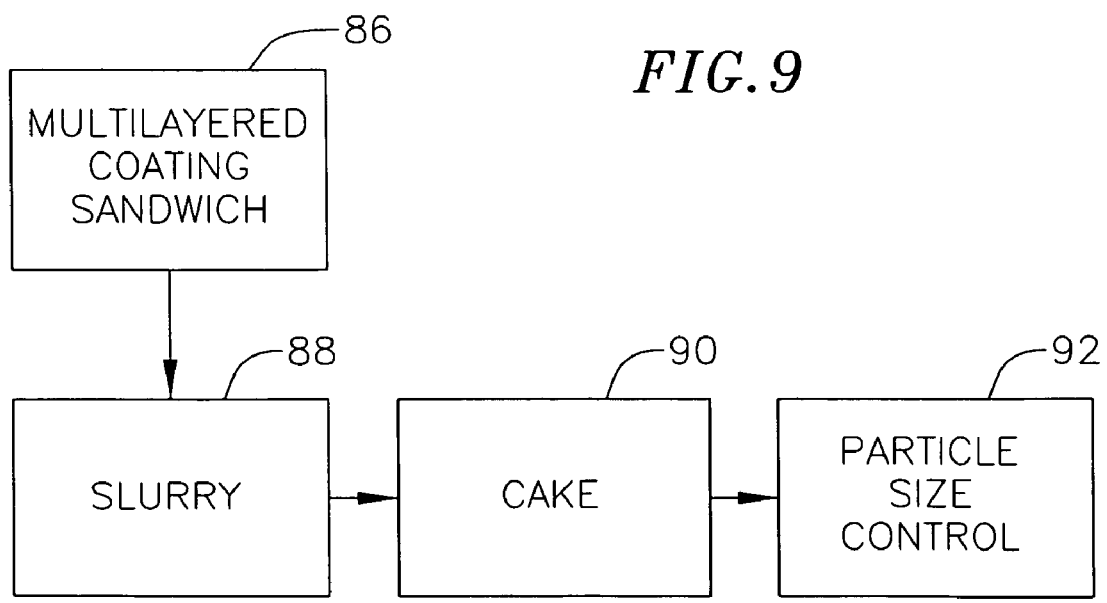
FIG. 9 is a functional block diagram schematically illustrating processing steps for making flakes from the multi-layer material made according to the second embodiment of the invention.

FIGS. 8 and 9 illustrate an alternative process for making the flakes illustrated in FIG. 6 or 7. In the embodiment illustrated in FIG. 8, the process equipment comprises a vapor deposition chamber 66 which contains a chilled rotating drum 68 and a flexible insoluble polyester carrier film 70 extending from a first reversible winding station 72 around a length of the drum's surface to a second reversible winding station 73. The length of wrap on the drum is controlled by two idle rollers 74. This vacuum chamber also includes the standard vacuum pump and an auxiliary turbo pump to maintain the vacuum level during coating operations. Rotation of the drum causes the polyester film to travel past a first release coat source 76, a first protective coating source 78, a metallizing source 80, a second protective coating source 82 and a second release coat source 84, in that order. Thus, as the drum rotates in a counterclockwise direction with respect to FIG. 8 the entire length of the polyester carrier is unwrapped from station 72 and taken up on station 73 after passing through the coating processes in sequence from sources 76, 78, 80, 82 and 84. The polyester carrier is then rewound by reversing the web path and inactivating the second release coating source 84 and then repeating the first step, but in a reverse (clockwise) direction so that the coatings are next applied from sources 82, 80, 78 and 76, in that order. The entire PET coated film is then taken up on station 72 and the sequence of steps is then repeated to build up layers on the film in the same sequence used to produce the multi-layer sandwich 38 of FIG. 4 (and the resulting coated metal flakes 32 of FIG. 7).

Alternatively, in the instance in which the single layer metal or glass flakes of FIG. 6 are to be produced, the multi-layer sandwich 64 illustrated in FIG. 3 is built up on the polyester carrier 70 by inactivating the protective coating sources 78 and 82.

FIG. 9 illustrates processing of the multi-layered coating sandwich 86 built up on the polyester film which is removed from the vacuum chamber 66 and introduced into an organic solvent stripping process at 88 to remove the sandwich material from the PET. The solvent is then subjected to centrifuging to produce a cake 90 of concentrated flakes which is later subjected to particle size control (homogenizing) at 92.

Suitable carriers on which the multi-layer sandwich material may be deposited must ensure that the deposits of thin layers are smooth and flat. Polyester films or other polymeric films having a high tensile strength and resistance to high temperature can be used, along with metal drums, belts or plates which can be stainless steel or chrome plated.

In one embodiment of the invention, polymeric release coats are applied for the purpose of facilitating later separation of the flake layers built up in the multi-layer sandwich material. Prior art use of cross-linked polymeric layers bonded between vapor deposited metal layers in a polymer/metal vapor deposition process inhibits later separation of the metallized layers into flakes. Polymerization of the polymeric layers such as by EB curing prevents subsequent re-dissolving of the polymeric layers and so the aluminum flake layers do not easily come apart. In the present process, the intervening polymeric layers are vaporized and deposited while under vacuum in the vacuum deposition chamber. The polymeric release material is preferably a flowable low viscosity, relatively low molecular weight very clean thermoplastic polymer or monomer which is essentially free of any volatiles that would be evolved during the coating process. Such a material is preferably not a blend of different polymeric materials including additives, solvents and the like. When the polymeric material is heated to its melt or coating or deposition temperature, continuous operation of the vacuum pump in the vacuum chamber is not adversely affected by volatiles. The preferred release coat material promotes intercoat separation between alternating vacuum deposited metal or glass flake or multi-layer flake layers. The release layer accomplishes this objective by being dissolvable in a suitable organic solvent. The release material also is metallizable and also requires sufficient adhesion to enable stack build-up on a rotating drum, as well as being EB vaporizable. The desirable release coat material must have a sufficiently high molecular weight or resistance to melting such that it resists heat build up on the drum or other carrier without becoming flowable. Heat build up comes not only from the metal deposited on the release layer but also from operation of the deposition sources inside the chamber. The ability of the release coat to resist flowability can ensure that flakes with high brightness can be produced because the release coat surface on which metal is deposited remains smooth. The release material also must be one which can survive the heat of EB deposition. It must also not be a material, such as certain low molecular weight materials, which detrimentally affects vacuum pressure maintained in the chamber, say be causing the chamber to lose vacuum. Maintaining a minimum operating vacuum level in the chamber is required to maintain production speed without breaking the vacuum. During subsequent stripping and treatment with organic solvents, essentially all of the release coat material is removed from the flakes. However, in the event that some small amount of release coat material may remain on the flakes after the flake layers are broken down into particles, the system can withstand some residue from the release coat, particularly if the flakes are subsequently used in acrylic inks or paints or coating systems in which the flakes are compatible.

Referring to the embodiment of FIG. 2, the multi-layer sandwich is made by applying the coatings directly to the rotating drum, and this is a desirable process because it has lower production costs than the process of coating a PET carrier. Each such cycle involves breaking the vacuum, taking out the sandwich layer for further processing outside the vacuum chamber, and re-charging the vacuum. The rate at which the process can be run, in building up layers, can vary from approximately 500 to 2,000 feet per minute. Metallizing only in the vacuum can operate at higher speeds.

In the embodiments in which the single layer flakes are produced, the flakes can have high aspect ratios. This is attributed, in part, to the capability of cleanly removing the intervening release coat layers from the metallized flakes. With thermoset or cross-linked polymeric layers bonded in between the metal layers, the layers cannot be easily separated and resulting flakes have lower aspect ratios. In one embodiment, the process of this invention produces single layer reflective aluminum flakes approximately 5 to 500 angstroms thick, and approximately 4 to 12 microns in particle size.

The release coat materials are applied in exceedingly thin layers preferably about 0.1 to about 0.2 microns for coated layers and about 100 to 400 angstroms for EB deposited layers.

In the embodiments in which the metal flakes are coated on opposite sides with the protective polymeric film layers, the protective coating layers are applied at a thickness of about 150 angstroms or less. A preferred protective coating material is silicon dioxide or silicon monoxide and possibly aluminum oxide. Other protective coatings can include aluminum fluoride, magnesium fluoride, indium tin oxide, indium oxide, calcium fluoride, titanium oxide and sodium aluminum fluoride. A preferred protective coating is one which is compatible with the ink or coating system in which the flakes are ultimately used. Use of the protective coatings on the metal flakes will reduce aspect ratio of the finished flake product, although the aspect ratio of this multi-layer flake is still higher than the ratio for conventional flakes. However, such flakes are more rigid than the single layer flakes, and this rigidity provided by the clear glass-like coated metal flakes can, in some instances, make the coated flakes useful in fluidized bed chemical vapor deposition (CVD) processes for applying certain optical or functional coatings directly to the flakes. OVD coatings are an example. CVD coatings can be added to the flakes for preventing the flakes from being prone to attack by other chemicals or water. Colored flakes also can be produced, such as flakes coated with gold or iron oxide. Other uses for the coated flakes are in moisture-resistant flakes in which the metal flakes are encapsulated in an outer protective coat, and in micro-wave active applications in which an encapsulating outer coat inhibits arcing from the metal flakes. The flakes also can be used in electrostatic coatings.

In an alternative embodiment there may be instances in which the release coat layers comprise certain cross-linked resinous materials such as an acrylic monomer cross-linked to a solid by UV or EB curing. In this instance the multi-layer sandwich is removed from the drum, or while on the carrier, it is treated with certain materials that de-polymerize the release coat layers such as by breaking the chemical bonds formed from the cross-linking material. This process allows use of conventional equipment utilizing vapor deposition and curing with EB or plasma techniques.

The process of this invention enables production of reflective flakes at high production speeds and low cost. The uncoated flakes produced by this invention can have a high aspect ratio. Where aspect ratio is defined as the ratio of particle size to thickness, and the average flake size is approximately 6 microns by 200 Angstroms (one micron=10,000 Angstroms) the aspect ratio 60,000/200 is or about 300:1. This high aspect ratio is comparable to the Metalure flakes described previously. For the embodiments in which flakes are coated on both sides with protective layers, the aspect ratio of these flakes is approximately, 60,000/600 or about 100:1.

Embossed flake also can be made by the process of this invention. In this instance, the carrier or deposition surface (drum or polyester carrier) can be embossed with a holographic or diffraction grating pattern, or the like. The first release layer will replicate the pattern, and subsequent metal or other layers and intervening release layers will replicate the same pattern. The stack can be stripped and broken into embossed flakes.

One process for speeding production of the flake products made by this invention utilizes three side-by-side vacuum chambers separated by air locks. The middle chamber contains a drum and the necessary deposition equipment for applying the layers of flake material and release coats to the drum. When the deposition cycle is completed, the drum and coating are transferred to the vacuum chamber downstream from the deposition chamber, through the air lock, for maintaining the vacuum in both chambers. The middle chamber is then sealed off. A drum contained in the upstream chamber is then moved to the middle chamber for further deposition. This drum is moved through an air lock to maintain the vacuum in both chambers. The middle chamber is then sealed off. The coated drum in the downstream chamber is removed, stripped of its deposited layers, cleaned and replaced in the upstream chamber. This process enables continuous coating in the middle vacuum chamber without breaking its vacuum.

EXAMPLE 1

The following multi-layer construction was made: release layer/metal/release layer. The release layer was Dow 685D extrusion grade styrene resin and the metal layer was aluminum from Materials Research Corp. 90101E-AL000-3002.

The construction was repeated 50 times, i.e., alternating layers of aluminum and styrene release coats.

The styrene used in the release layer was conditioned as follows:

The styrene pellets were melted and conditioned in a vacuum oven at 210° C. for 16 hours and then removed to a desiccator to cool.

An aluminum foil lined graphite crucible was used to hold this material.

This crucible was placed in a copper lined Arco Temiscal single pocket electron beam gun hearth.

The aluminum pellets were melted into a copper lined Arco Temiscal four-pocket electron beam gun hearth.

The electron beam guns were part of a 15 KV Arco Temiscal 3200 load-lock system. Two mil PET film from SKC was cut into three seventeen inch diameter circles and attached to seventeen inch diameter stainless steel planetary discs located in the vacuum chamber. The chamber was closed and roughed to ten microns then cryopumped to a vacuum of 5×10−7 Torr.

The release and metal material were vapor deposited in alternating layers. The release layer was deposited first at 200 angstroms as measured by a Inficon IC/5 deposition controller. The release layer was followed by a metal layer vapor deposited at 160 angstroms also measured by the IC/5 controller. The controller for the aluminum layer was calibrated by a MacBeth TR927 transmission densitometer with green filter. As mentioned, this construction was repeated 50 times. The vapor deposited aluminum layer had a good thickness of 1.8 to 2.8 optical density as measured by a MacBeth densitometer. This value measures metal film opacity, via a light transmission reading.

When the deposition was complete, the chamber was vented with nitrogen to ambient pressure and the PET discs removed. The discs were washed with ethyl acetate then homogenized using a IKA Ultra Turrax T45 to reach a particle size of 3 by 2 microns, measured on Image-pro plus image analyzer using a 20× objective and averaged from a set of 400 particles.

The dispersion was then made into an ink and drawn down on a Lenetta card for ACS spectrophotometer testing. This test measures flake brightness. An ACS value above about 68 is considered desirable for this particular product. ACS readings were 69.98 for the Metalure control and 70.56 for the batch. The inks were drawn down on clear polyester and density readings were 0.94 for the batch and 0.65 for the Metalure control. Readings were taken on a MacBeth densitometer using a green filter.

EXAMPLE 2

The following multi-layer construction was made: release layer/protective coat/metal/protective coat/release layer.

Three separate constructions were made as follows:

| Construction 1 | |
|---|---|
| REL | Dow 685D |
| PROT | Cerac Silicon Oxide S-1065 |
| MET | Materials Research Corp. 90101E-AL000-3002 |
| PROT | Cerac Silicon Oxide S-1065 |
| REL | Dow 685D |
| Construction 2 | |
| REL | Dow 685D |
| PROT | Cerac Aluminum Oxide A-1230 |
| MET | Materials Research Corp. 90101E-AL000-3002 |
| PROT | Cerac Aluminum Oxide A-1230 |
| REL | Dow 685D |
| Construction 3 | |
| REL | Dow 685D |
| PROT | Cerac Magnesium Fluoride M-2010 |
| MET | Materials Research Corp. 90101E-AL000-3002 |
| PROT | Cerac Magnesium Fluoride M-2010 |
| REL | Dow 685D |

The construction were repeated ten times by the same process describe in Example 1 and were evaluated as protective coated flake, i.e., this test indicated that multi-layer flakes having optical utility could be made by building up the layers of flake material on a carrier in a vacuum chamber between intervening layers of dissolvable release material, in which the flake layers are built up continuously (without breaking the vacuum) while depositing the release layers and flake layers from deposition sources operated within the vacuum chamber, followed by stripping, and particle size control.

EXAMPLE 3

The following multi-layer constructions were made:

| Construction 1 | |
|---|---|
| REL | Dow 685D |
| NONMET | Silicon Oxide S-1065 |
| REL | Dow 685D |
| Construction 2 | |
| REL | Dow 685D |
| Stack | Titanium Dioxide Cerac T-2051 |
| Stack | Silicon Oxide Cerac S-1065 + Oxygen |
| MET | Materials Research Corp. 90101E-AL000-3002 |
| Stack | Silicon Oxide Cerac S-1065 + Oxygen |
| Stack | Titanium Dioxide Cerac T-2051 |
| REL | Dow 685D |

The construction was repeated ten time by the same process described in Example 1. This test indicated that the process of vapor deposition can form built-up layers of optical stacks between intervening release coat layers in a vacuum chamber, followed by stripping and particle size control, which yielded flakes having utility for such applications as inks and coatings.

EXAMPLE 4

The following constructions may be possible constructions for decorative flake:

Construction 1

| | |
|---|---|
| REL | Dow 685D |
| Stack | Iron Oxide Cerac I-1074 |
| Stack | Silicon Oxide Cerac S-1065 + Oxygen |
| Stack | Iron Oxide Cerac I-1074 |
| REL | Dow 685D |

Construction 2

| | |
|---|---|
| REL | Dow 685D |
| Stack | Iron Oxide Cerac I-1074 |
| Stack | Silicon Oxide Cerac S-1065 + Oxygen |
| MET | Aluminum Materials Research Corp. 90101E-AL000-3002 |
| Stack | Silicon Oxide Cerac S-1065 + Oxygen |
| Stack | Iron Oxide Cerac I-1074 |
| REL | Dow 685D |

The constructions also may be used for a gonio chromatic shift.

EXAMPLE 5

Polymeric release coat layers were deposited in a vacuum chamber, using an EB source, and coated with a vapor deposited aluminum layer.

The following constructions were made:

Construction 1

Dow 685D styrene resin was conditioned in an oven for 16 hours at 210° C. The material was EB deposited on polyester at a thickness of 200 to 400 angstroms and metallized with one layer of aluminum at densities of 2.1 to 2.8.

Construction 2

Piolite AC styrene/acrylate from Goodyear was conditioned for 16 hours at 190° C. The material was EB deposited on polyester at a coat weight of 305 angstroms metallized with one layer of aluminum at a density of 2.6.

Construction 3

BR-80 acrylic copolymer from Dianol America was conditioned for 16 hours at 130° C. The material was EB deposited on polyester at a thickness of 305 angstroms metallized with one layer of aluminum at a density of 2.6.

Construction 4

Dow 685D styrene resin was conditioned for 16 hours at 210° C. The material was EB deposited on polyester at a thickness of 200 angstroms and metallized with one layer of aluminum at a density of 2.3. This was repeated to form a stack of 10 layers of aluminum separated by the intervening release coat layers.

These layered materials were stripped from the PET carriers using ethyl acetate solvent and reduced to a controlled particle size in a T8 lab homogenizer. The resulting flakes were similar in optical properties to Metalure flakes, in that they had similar brightness, particle size, opacity and aspect ratio.

In a further test with a construction similar to Construction 1, aluminum metallized to an optical density of 2.3 was stripped from a PET carrier in acetone and broken into flakes. This test observed the effect of release coat thickness changes. The results indicated best release properties with an EB deposited release coat in the range of about 200 to about 400 angstroms.

EXAMPLE 6

Several tests were conducted to determine various polymeric release coat materials that may be useful in this invention. Laboratory Bell Jar tests were conducted to determine polymers that may be EB deposited. Methyl methacrylate (ICI's Elvacite 2010) and a UV-cured monomer (39053-23-4 from Allied Signal) produced good results. Poor results were observed with butyl methacrylate (Elvacite 2044) (loses vacuum in EB), cellulose (turned black at 280° F.), and polystyrene rubber (charred).

EXAMPLE 7

The tests described in Example 1 showed that a release coat made from the Dow 685D styrene polymer could produce usable flake products. Several other tests were conducted with Dow 685D styrene resin release coats as follows:

(1) Conditioned at 190° C, coated at 1,000 angstroms and metallized with aluminum. Resin film built too high produced a hazy metallized layer.

(2) Not conditioned in oven; when attempting to EB melt the styrene beads the E-Beam caused the beads to move in the crucible.

(3) Conditioned at 210° C., coated from 75 to 150 angstroms then metallized. Aluminum stripped poorly or not at all.

(4) Conditioned at 210° C., coated at 600 angstroms and metallized one layer of aluminum at 1.9 density. Aluminum stripped slowly and produced a curled flake.

This invention makes it possible to produce thin decorative and functional platelets of single or multilayer materials with thickness from about 5 to about 500 angstroms single layer, from about 10 to 2000 angstroms multilayer, with average outer dimensions from about 0.01 to 150 micrometers. The flakes or particles made by the process of this invention are referred to as angstrom scale particles because they are useful flake material that can be made with a thickness in the low angstrom range mentioned above. Some particles made by this invention can be characterized as nanoscale particles. As is well known, 10 angstroms equals one nanometer (nm), and the nanoscale range is generally from one to 100 nm. Thus, some of the angstrom scale particles (thickness and/or particle size) of this invention fall within the nanoscale range.

These particles can be used as functional platforms by themselves or coated with other active materials. They can be incorporated into or coated onto other materials. As mentioned above, they are produced by depositing materials or layers of materials such that the mono or multi-layered platelets are interleaved with polymeric releasing layers. The supporting system for these layer sandwiches can be a plate, film, belt, or drum. The functional materials can be applied by PVD (physical vapor deposition) processes and the releasing layers can be applied by PVD.

Once the sandwich layers with the interleaving releasing layers are formed the material can be removed from the supporting system and functional layers can be separated from the releasing layers. This can be done cryogenically, with the appropriate solvent, or with a supercritical fluid. The resulting material can be turned into platelets and sized by grinding, homogenizing, sonolating, or high-pressure impingement.

Centrifuging or filtering results in a cake, slurry, or dried material. Other active materials can be added to the particles via CVD or reacted with materials such as silanes to promote adhesion. Then the materials can then be incorporated into or coated onto the desired material such as paints, coatings, inks, polymers, solids, solutions, films, fabrics, or gels, for functional uses.

Various angstrom scale flake constructions of this invention include (1) aluminum, metal alloy and other metal (described below) monolayer flakes; (2) single layer dielectrics, inorganic or cross-linked polymer flakes; (3) multi-layer inorganics; (4) optical stacks; (5) inorganic or organic/metal/inorganic or organic multilayer flakes; (6) metal/inorganic/metal flakes/ and (7) CVD or chemically reacted surface coated flakes.

The uses for these nanoscale and high aspect ratio particles are as follows.

Optical Aesthetic

High aspect ratio materials can provide bright metallic effects as well as colored effects. Metals such as aluminum, silver, gold, indium, copper, chromium or alloys and metal combinations such as aluminum copper, copper zinc silver, chromium nickel silver, titanium nitride, titanium zirconium nitride and zirconium nitride may be used to produce these materials. Sandwiches of metals and dielectric materials can produce various colors and effects. Inert materials can be used as the outside layer to protect the inner layers from oxidation and corrosion. Examples of some sandwiches are SiO/Al/SiO, MgF/Al/MgF, Al/SiO/Al, Al/MgF/Al, but many other combinations are possible. Flakes of metal or metal oxides can be used as a base to attach both organic and inorganic materials that provide pigment-like colors.

Optical Functional

Nanoscale and high aspect ratio particles can have many applications that take advantage of optical properties. Particles of aluminum oxide, titanium dioxide, zinc oxide, indium tin oxide, indium oxide can be incorporated into coatings and polymers to reflect, scatter, or absorb UV and IR light. Also phosphorescent and fluorescent materials can be used to produce other important effects.

Mechanical

These particles can be incorporated into or applied to the surface of materials to enhance their properties. Particles of silicon monoxide, aluminum dioxide, titanium dioxide, and other dielectrics can be incorporated into materials to improve properties such as flame retardancy, dimensional stability, wear and abrasion resistance, moisture vapor transmission, chemical resistance, and stiffness.

Chemical

Active materials can be applied to the surface of these particles to provide small high surface areas that can be introduced into chemical processes. These high surface area particles are ideal for catalysts. They can be platelets of the active material or flakes made to support an active coating. Examples of active materials are platinum, palladium, zinc oxide, titanium dioxide, and silicon monoxide. Flakes produced from metal (lithium) doped materials may have uses in batteries.

Electrical

Electrical properties can be imparted to various materials and coatings by incorporating particles of various materials as both monolayers and multilayers to effect conductivity, capacitance, EMI, and RFI. The absorption, transmission, and reflectance of microwave and radar energy can be modified by coating or incorporating particles of metals or metal dielectric sandwiches. Superconducting materials such as magnesium boride also can be made into angstrom scale particles.

Biological

By placing an anti fungal or antibacterial coating on these thin platelets then incorporating them into inks and coating active agents can be effectively transported to the surfaces.

Nanoparticles

Nanoparticles can be produced by vapor depositing a flake material as discrete particles. In the industry it is well known that nucleation and film growth play an important role in formation of quality PVD coatings. During the initial deposition nuclei are formed that grow in size and number as the deposition continues. As the process continues these islands begin to join together in channels that later fill in to form the final continuous film. To make nanoparticles, the coating process only reaches the island stage before the next layer of releasing material is applied. This allows the small particles to be trapped between the releasing layers in the multilayer construction described below. They can later be released by dissolving the releasing material with the proper solvent.

Another process for making nanoscale particles is to produce the flake material below 50 angstroms and then reduce the particle diameter with a secondary operation.

Use of Flake Material in Coatings

Flake material was put into a coating for use in the above applications using the following procedure:

Various material compositions of materials were converted into flake form. The converted flake was then incorporated, on a surface area basis, into a vehicle.

| Vehicle Composition: | |
|---|---|
| Toluene | 28 pts |
| Isopropanol | 28 pts |
| Methyl Ethyl Ketone | 28 pts |
| Elvacite 2042 | 16 pts |

The actual weight of the flake used in this example was derived by the thickness and the density of the chemical compound. This derivation was used to study the effect of the chemical compound. The flake was supplied in a slurry form in acetone. The first step in the process was to measure the percent solids by weight. After finding the solids, the amount of slurry material to use can be determined by the following table.

| Material | Density | Thickness of the flake | Dry flake per 100 g vehicle solution | Percent wt solids of slurry | Weight to use per 100 g vehicle sol. |
|---|---|---|---|---|---|
| Titanium Dioxide | 4.26 | 200 A | 0.09 g | | |
| Titanium Monoxide | 4.93 | 200 A | 0.08 g | | |
| Silicon Dioxide | 2.2 | 200 A | 0.20 g | | |
| Silcone Monoxide | 2.13 | 200 A | 0.20 g | | |
| Aluminum Oxide | 3.97 | 200 A | 0.10 g | | |
| Indium Oxide | 7.13 | 200 A | 0.06 g | | |
| Indium Tin Oxide | 4.48 | 200 A | 0.09 g | | |
| Zinc Oxide | 5.6 | 75 A | 0.03 g | | |
| Indium | 7.3 | 200 A | 0.06 g | | |

-continued

| Material | Density | Thickness of the flake | Dry flake per 100 g vehicle solution | Percent wt solids of slurry | Weight to use per 100 g vehicle sol. |
|---|---|---|---|---|---|
| Magnesium Fluoride | 3.18 | 200 A | 0.13 g | | |
| Silicone | 2.33 | 200 A | 0.016 g | | |

The flake was mixed into the vehicle at the appropriate weight. The slurry was then coated onto a gloss polyester film, 0.002 inches thick, to achieve a final coating thickness of 2.6 to 3.0 g/m². The coating was allowed to dry then tested in two ways.

Method for Evaluating Heat Reflective Properties:

The prepared coatings were transferred to the surface of a sheet of rigid polyvinyl chloride (PVC) decorated with EF18936L using heat and pressure. The polyester film was removed after transfer. Three inch by three inch panels were prepared with a blank(vehicle without flake) and the test flake. These panels were then evaluated using the ASTM D4809-89 method for predicting heat buildup in PVC building products. The results were reported for both the blank and the test flake panel.

Method of Evaluating UV Screening Properties:

A base test sheet was prepared by applying a film comprising of the following materials to a rigid PVC sheet:

| Color Coat | I80126 | Vehicle | 59.5 pts |
|---|---|---|---|
| | I80161 | White Dispersion | 27.0 pts |
| | I8980 | Isoindolinone Yel Disp | 5.4 pts |
| | MEK | Methyl Ethyl Ketone | 8.1 pts |

Apply to 0.002 mil gloss polyester using 2-137 HK printing plates

| Size | L56537 |
|---|---|

Apply after color coats using 1—137 HK printing plate

The blank and slurry are prepared on polyester as in the previous method and transferred to the panels described above. Both the blank and the test flake panel are placed in a Sunshine Carbon Arc (Atlas) weatherometer set up on the Dew Cycle protocol. Initial gloss and color readings are taken and recorded every 500 hours of operating time.

The multilayer particle releasing layer can be made from conventional organic solvent-based polymers deposited in a PVD process. A number of different materials can be used such as polymers, oligimers, and monomers. These materials can be evaporated by electron beam, sputtering, induction, and resistance heating.

One of the difficulties with using bulk polymer in this process is to effectively feed the polymer into the evaporating system without its being exposed for long periods of time to high temperature, which can have detrimental effects. Another difficulty is evaporating and conducting the polymer vapor to the support system while not contaminating the vacuum system or degrading the vacuum.

Several approaches can overcome these problems with polymer delivery. One approach is to coat the polymer onto a carrier material such as a wire or ribbon made of metal or material that can withstand the temperatures of vaporization. This coated material is then fed into the polymer vapor die where it is heated and the polymer is vaporized and the vapor is conducted to the support system. Another approach is to melt the polymer and reduce its viscosity and then extrude or pump the material into the polymer vapor die. A gear pump, extruder, or capillary extrusion system (Capillary Rehometer) like the polymer vapor die can provide a vaporizing surface that is heated to the appropriate temperature. The die then conducts the vapor to the support system. It is necessary to provide a cooled surface to condense any stray polymer vapor that leaves the polymer die support system area and differentially pump this area as well.

Bell Jar Process

Figure 10:
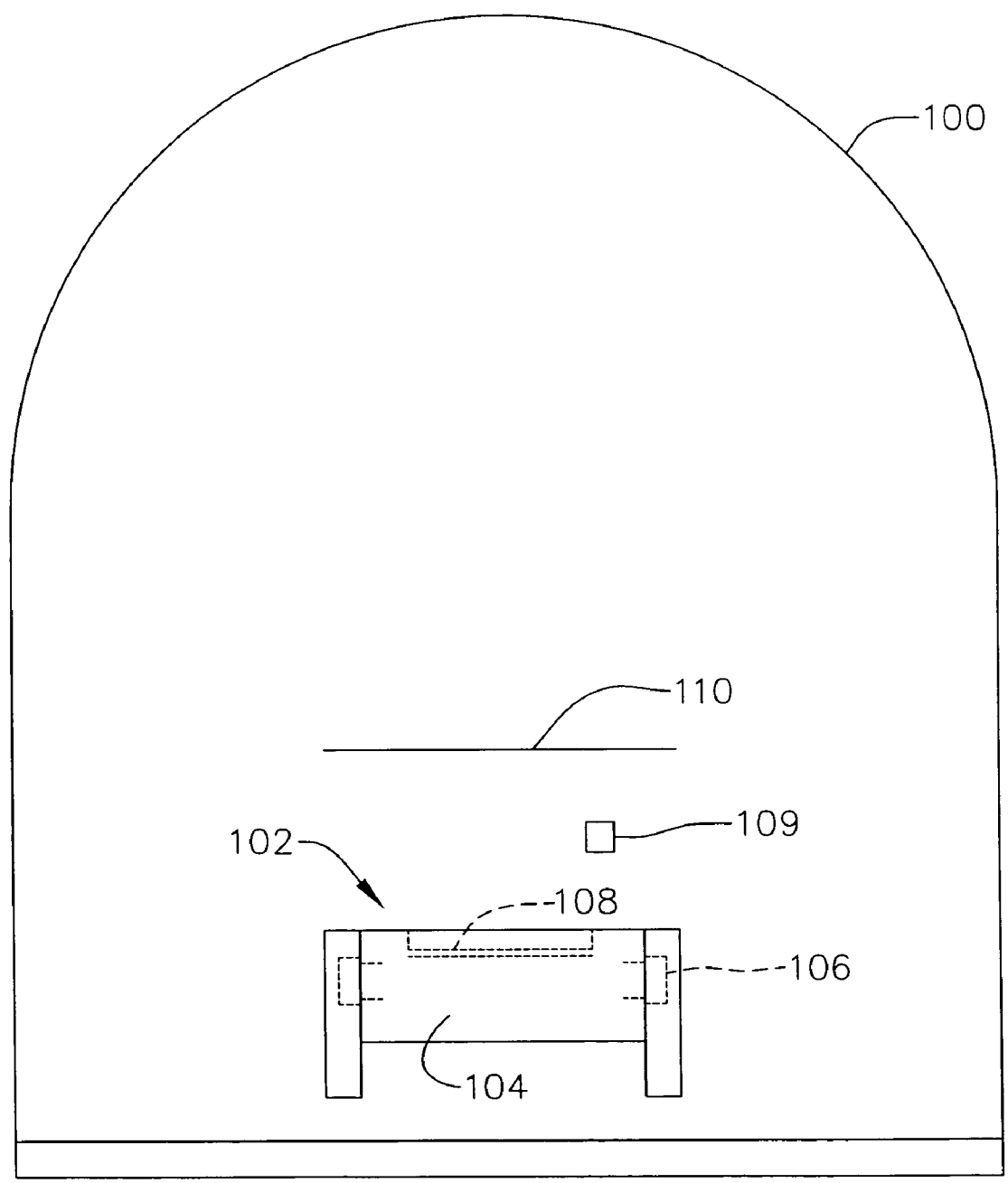
FIG. 10 is a semi-schematic elevational view illustrating a bell jar vacuum chamber.

Referring to FIG. 10, a vacuumizable bell jar 100 is modified with a heater block 102 installed on the floor of the bell jar. The block comprises a heated polymer vapor chamber 104 having a cavity 106 carved out to hold the desired sample. A crucible 108 made of aluminum foil is fitted to the block and approximately 0.3 g of the desired material is placed in the crucible. The crucible is then placed in the heater block.

Above the heater block, a deposition gauge 109 is positioned one inch from the top of the block. As the block is heated, this gauge will measure the amount of material evaporated in angstroms per second (Å/sec).

Above the deposition gauge, a polyester sheet 110 is clamped between two posts (not shown). The material evaporated from the block is deposited on this film. In another step, this film is metallized.

Once the sample, deposition gauge, and polyester film are in place, the bell jar is closed and the vacuum cycle is started. The system is evacuated to a pressure between $2\times10^{-5}$ torr and $6\times10^{-5}$ torr and the trial is ready to begin.

The heater block begins at approximately room temperature. Once the desired vacuum is achieved, power to the block is turned on. The block is set to ramp up to 650° C. in a 20 minute interval. Measurements are taken every minute. The time, current block temperature (° C.), deposition gauge reading (Å/sec), and current vacuum pressure (torr) are documented each minute. The trial ends when either the deposition gauge crystal fails or when all of the material has been evaporated and the deposition gauge reading falls to zero.

At the end of the trial, the bell jar is opened to atmosphere. The polyester is removed and set aside to be metallized and the spent crucible is discarded. The data is then charted for comparison to all other materials run.

Bell Jar Polymer Trials

Several experiments were run on different polymers in the bell jar metallizer. The procedure described in "Bell Jar Procedure" was followed for all of these experiments. For each experiment, the trial time, temperature, deposition gauge reading, and vacuum pressure were documented. From these data it can be determined what materials have greater effect on the vacuum and which material provide the highest deposition rates. A higher deposition rate means an eventual manufacturing sized apparatus will be able to run at higher speeds. However, materials that have greater effects on the vacuum pressure could cause cleanup and possible pump down problems after extended periods of operation.

Trials 1, 2, 6, and 7 were run using the Dow 685D polystyrene. This polymer has a reported molecular weight of about 300,000. All four trials produced similar results. Deposition rates held at around 10 Å/sec until a temperature of approximately 550° C. was reached. Up until that temperature, there was very little effect on the vacuum. The pressure was generally raised less than $2\times10^{-5}$ torr. Above 550° C. the rate rose dramatically and the pressure rose into the range of $1.2\times10^{-4}$ to $1.8\times10^{-4}$ torr. This is still a minimal impact on the vacuum pressure.

Trial 3 was run with Elvacite 2045, an isobutyl methacrylate with a molecular weight of 193,000. The deposition rose as high as 26.5 Å/sec at a temperature of 500° C. At this temperature the vacuum pressure had risen to $3.6\times10^{-4}$ torr from a starting pressure of $5.2\times10^{-5}$ torr.

The fourth trial used Elvacite 2044, which is an n-butyl methacrylate material with a molecular weight of 142,000. Deposition for the 2044 reached a peak of 30 Å/sec at 500° C. At this temperature the vapor pressure reached $2.0\times10^{-4}$ torr.

Trials 5 and 19 were run with Endex 160, which is a copolymer material. The Endex 160 reached its maximum deposition at 413° C. with a rate of 11 Å/sec. The deposition had almost no impact on the vacuum as it was ultimately only raised by $1.0\times10^{-6}$ torr to a final reading of $4.4\times10^{-5}$ torr.

The eighth trial was run with Elvacite 2008, a methyl methacrylate material with a molecular weight of 37,000. The highest deposition rate was achieved at 630° C. with a rate of 67 Å/sec. The final vacuum pressure was raised to $1.0\times10^{-4}$ torr.

Trials 9 and 10 were run with Piccolastic D125. This material is a styrene polymer with a molecular weight of 50,400. Deposition rates of 108 Å/sec were reached at 500° C. and throughout the trials there was minimal impact on the vacuum.

Trials 11 and 12 were run with Piccolastic A75. This is another styrene monomer, but with a low molecular weight of 1,350. Deposition rates started very early and rose to a maximum of 760 Å/sec when the temperature reached 420° C. For both trials there was once again very minimal impact on the vacuum pressure.

Trials 13 and 14 were run with a 50,000 MW polystyrene standard from Polyscience. These samples have very tight molecular weight distributions. For these trials, a deposition of 205 Å/sec was achieved at a temperature of 560° C. At that deposition, the vacuum pressure rose to $6.2\times10^{-5}$ torr, a rise of $1.4\times10^{-5}$ torr over the starting pressure.

Trials 15 and 16 were run with another polystyrene standard from Polyscience, but this one had a molecular weight of 75,000. Deposition reached a rate of about 30 Å/sec at a temperature of 590° C. At this temperature, the vacuum pressure had risen to $3.0\times10^{-4}$ torr, a fairly significant rise.

Trial 17 was run with Endex 155, a copolymer of aromatic monomers with a molecular weight of 8,600. The maximum deposition was reached at 530° C. with a rate of 78 Å/sec. At the end of the trial the vacuum pressure had risen to $1.0\times10^{-4}$ torr.

Trial 18 was another polystyrene standard from Polyscience. This sample had a molecular weight range of 800-5,000. Deposition was as high as 480 Å/sec at a temperature of 490° C. There was little to no impact on the vacuum pressure during the entire run.

Trial 20 was run with a standard of polymethyl methacrylate from Polyscience. This sample had a molecular weight of 25,000. A final deposition rate was achieved at 645° C. with a rate of 50 Å/sec. At this condition, the vacuum pressure had risen to $1.0\times10^{-4}$ torr.

Trial 21 was run with Elvacite 2009, a methyl methacrylate polymer treated to contain no sulfur. The molecular weight of this material was 83,000. A final deposition rate of 26 Å/sec was reached at a temperature of 580° C. The vacuum pressure had risen to $1.8\times10^{-4}$ torr from an initial reading of $4.2\times10^{-5}$ torr.

Trials 22 and 26 were run with Elvacite 2697, a treated version of a methyl/n-butyl methacrylate copolymer. The molecular weight of this material was 60,000. The Elvacite 2697 had a final deposition rate of 20 Å/sec at a temperature of 580° C. Vacuum pressure rose to $1.0\times10^{-4}$ torr at the end of the trial.

Trial 23 was run with Elvacite 2021C, a treated methyl methacrylate. This material had a molecular weight of 119,000. A final deposition rate of 30 Å/sec was reached at 590° C. This trial had a significant impact on the vacuum as the final pressure was $4.4\times10^{-4}$ torr, an order of magnitude increase over the initial vacuum pressure.

Trial 24 was run with Lawter K1717, a polyketone. A maximum deposition rate of 300 Å/sec was reached at 300° C. At this temperature the vacuum pressure had risen to $7.0\times10^{-5}$ torr. At the end of the trial, a great deal of soot remained in the crucible. This indicated that some of the material had actually combusted rather than just being evaporated.

Trial 25 was run with Solsperse 24000, a dispersing agent. This sample also left a soot residue in the crucible indicating combustion during the trial. However, there was a deposition rate recorded up to 100 Å/sec at 360° C. The vacuum pressure rose $1.0\times10^{-5}$ torr over the course of the experiment.

Trial 27 was run with Elvacite 2016, a non-treated methyl/n-butyl methacrylate copolymer. This has a molecular weight of 61,000. At 630° C., the deposition rate reached 135 Å/sec. At this condition, the vacuum pressure had been significantly raised to $3.0\times10^{-4}$ torr.

Trial 28 was run with Elvacite 2043, an ethyl methacrylate polymer with a molecular weight of 50,000. At 600° C., the deposition rate was at 98 Å/sec. At this condition, the vacuum pressure was at $1.0\times10^{-4}$ torr.

Trial 29 was run with Kraton G1780. This material is a multiarm copolymer of 7% styrene and ethylene/propylene. Deposition reached a high of 70 Å/sec at a temperature of 600° C. The final vacuum pressure rose to $8.2\times10^{-5}$ torr. During the trial, the deposition rate held very steady and did not exhibit wild fluctuation that is common in all of the other trials, especially at higher temperatures.

Trial 30 was run with Kraton G1701. This material is a linear diblock polymer of 37% styrene and ethylene/propylene. An ultimate deposition rate of 102 Å/sec was reached at a temperature of 595° C. The vacuum pressure was at $8.6\times10^{-5}$ torr at this final condition.

Trial 31 was run with Kraton G1702. This is a linear diblock polymer of 28% styrene and ethylene/propylene. A final deposition rate of 91 Å/sec was reached at 580° C. The vacuum pressure had risen to $8.0\times10^{-5}$ torr at this condition.

Trial 32 was run with Kraton G1730M. This is a linear diblock polymer of 22% styrene and ethylene/propylene. The maximum deposition rate of 80 Å/sec was reached at 613° C. At this temperature, the vacuum pressure was $8.0\times10^{-5}$ torr.

Trial 33 was run with 1201 Creanova, a synthetic resin based on a urethane modified ketone aldehyde. This material achieved a deposition rate of 382 Å/sec at a temperature of 535° C. At this temperature there was minimal impact on the vacuum.

Trial 34 was run with Kraton G1750M. This is a multiarm copolymer of 8% styrene and ethylene/propylene. A deposition rate of 170 Å/sec was reached at 625° C. At this condition, the vacuum pressure rose to $9\times10^{-5}$ torr.

From these trials we reached the following conclusions. The greatest value of these experiments came from quantifying the effect various resins have on vacuum pressure. From the trials there appeared to be a correlation with molecular weight to the vacuum impact. The lower the molecular weight of the material, the less impact the evaporated material will have on the vacuum pressure of the system. There does not appear to be a correlation between temperature and deposition.

Drum with Block Procedure

Figure 12:
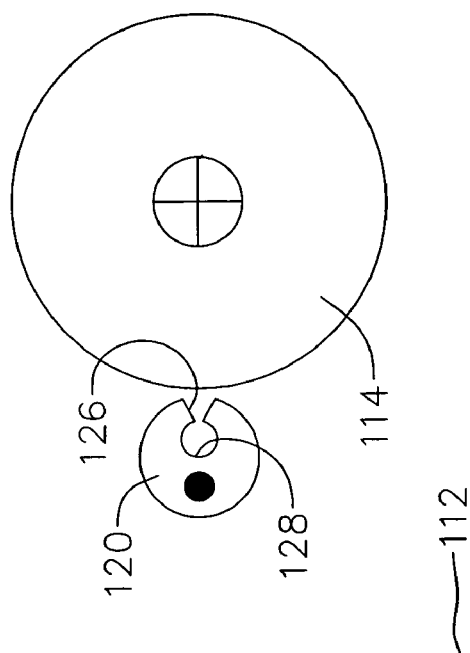
FIG. 12 is a side elevational view of a rotating drum and heated polymer vapor chamber shown in FIG. 11.
Figure 11:
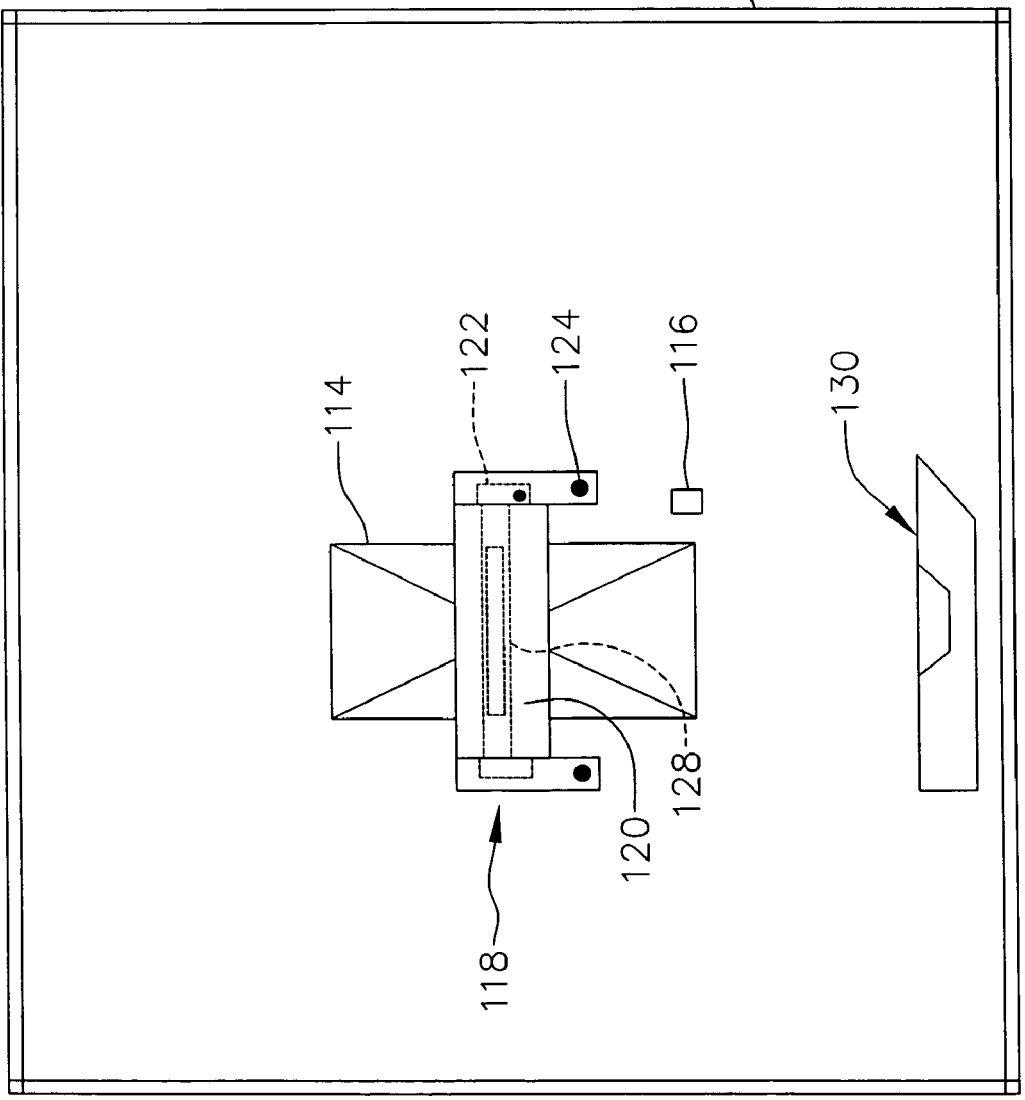
FIG. 11 is a semi-schematic side elevational view showing a vacuum chamber containing a rotating drum and heater block assembly.

Referring to FIGS. 11 and 12, a vacuumizable chamber 112 contains a rotating drum 114, a deposition gauge 116, and a heater block 118. The heater block comprises a heated polymer vapor chamber 120 fitted with a crucible 122 having a polymer source 124. The drum 114 is approximately one foot in diameter and six inches wide on the surface. It can rotate at a maximum speed of two rotations per minute. The heater block is cylindrical in shape with a slot 126 carved into one area. The slot is open into a cavity 128 running through the center of the block. The block has three independent heaters that can be used to control the temperature of the block. The deposition gauge 116 is placed approximately one inch in front of the slot. It can measure the amount of material passing through the slot in angstroms per second (Å/sec). This embodiment depicts an electron beam gun 130 in the vacuum chamber, but for this procedure, the EB gun is not used. This procedure can be used to screen polymers to determine their capability of being vapor deposited and therefore usable as a polymeric release coat.

To prepare a sample, the heater block can be opened and material is loaded into the cavity. Once this is done, the chamber is closed and the vacuum cycle is started. The chamber is evacuated until the pressure gets to at least $6 \times 10^{-5}$ torr.

The block begins at around room temperature. Once the desired vacuum is achieved, power to the three heaters is turned on. The heaters are set to ramp up to the desired temperature in a 20-minute interval. Measurements are transmitted to a computer file approximately every six seconds. The time, block temperature in three zones (° C.), deposition gauge reading (Å/sec), and current vacuum pressure (torr) are documented. The trial ends when either the deposition gauge crystal fails or when all of the material has been evaporated and the deposition gauge reading falls to zero.

At the end of the trial, the chamber is opened to atmosphere. The deposition crystal is changed and the block is loaded with new material for the next trial.

Polystyrene Trials in Polymer Block

Six separate trials were run using the Dow 685D polystyrene in each trial. This polystyrene is reported to have a molecular weight of approximately 300,000. In the trials, the ultimate block temperature was varied as well as the ramp time to reach the final temperature.

In trial 1, the block was programmed to reach 300° C. in a ramp time of 10 minutes. As the trial progressed, the polymer deposition rate was very low at no higher than 5 Å/sec. This rate held during the entire trial.

In the second trial the block was programmed to reach a final temperature of 325° C. with no ramp time set. The controllers were allowed to increase the temperature at their maximum possible rate. As temperature was reached, the deposition rate leveled out at about 30 Å/sec. With some fluctuation, this rate held constant until 15 minutes into the trial when the rate began to noticeably drop. By the end of the trial at 20 minutes, the rate had fallen to 15 Å/sec. This rate decrease is likely due to the exhaustion of the polymer supply.

In the third trial the block was set to reach an ultimate temperature of 350° C. in a ramp time of 10 minutes. As the temperature was reached, the deposition rate was at about 6 Å/sec. As the trial progressed the rate finally reached a peak of 14 Å/sec about 13 minutes into the experiment. By the end of the trial at 20 minutes the rate had fallen back to about 6 Å/sec. Polystyrene is theorized to begin a depolymerization at about 350° C. The deposition rate in the experiment may have been lower because the temperature was causing this depolymerization as well as the evaporation that would be sensed up by the deposition gauge.

Trial 4 had a 375° C. setpoint with no ramp to temperature. The deposition rate rose to 30-35 Å/sec in about 10 minutes, but did not hold steady there. As the temperature passed 350° C., the rate rose significantly and became erratic. The rate fluctuated from 40-120 Å/sec with no regular pattern. After 15 minutes of trial time, the deposition gauge crystal failed and the experiment was stopped. Above 350° C. the polymer has absorbed enough energy to depolymerize, so from that point on it liberates very low molecular weight material at high rates. This material includes monomers and dimers of the original polystyrene. This low end material is not useful in forming a polymer film.

The fifth trial also had a 375° C. final temperature, but this time with a 10 minute ramp time. The deposition was very steady at first, but once again above 350° C. the deposition became erratic. The rate fluctuated from 20 Å/sec to a peak of 110 Å/sec. The trial ended at about 18 minutes when the gauge crystal failed.

The final trial was at a 375° C. temperature, but with a 20 minute ramp time. The same behavior was exhibited as the previous two trials. Up to a temperature of 350° C. the deposition was fairly steady at a rate of about 20 Å/sec. As the temperature rose through 350° C. though, the rate once again became erratic. The rate fluctuated between 30 and 140 Å/sec and crystal failure once again caused the end of the experiment, this time at 23 minutes.

From these trials we reached the following conclusions. It appears that polystyrene exhibiting depolymerization or other physical breakdown at a temperature of approximately 350° C. is shown to be true in these experiments. In the trials above that temperature, the erratic behavior occurred at approximately the same temperature in all three cases. In the trial at 350° C., the deposition rate indicated another process was taking place since a higher rate was seen at the lower 325° C. setpoint. Unless a depolymerization or other process was taking place, the deposition rate at 350° C. should have been higher than the rate at 325° C. Also, for the trials at 375° C., an oily film was observed at the end of the trial. This material was shown to be polystyrene under FTIR analysis and the oily nature indicates it is likely a low molecular weight species of the polystyrene. This is further evidence that the original polymer (300,000 MW) was depolymerized. The trial at 350° C. left a slightly tacky residue, but it was not as oily as the residue from the 375° C. trials. The experiments run at 300° C. and 325° C. had a solid film left behind with no indication of tackiness or oil. From this set of experiments, it appears that a range of more than about 300° C. to less than about 350° C., and more preferably 325° C. is a temperature at which to run polymer deposition. The preferred temperature is low enough that polymer breakdown does not develop. It also provides a fairly high deposition rate that holds steady throughout the run.

Drum with Block and E-beam In block crucibles

The vacuum chamber 112, heater block 118 and rotating drum 114 illustrated in FIGS. 11 and 12 are used in this embodiment, along with the electron beam gun 130.

To add material, the heater block can be opened and material is loaded into the cavity 128. The drum is covered with PET film. The E-beam gun is typical of those used in the industry. It has four copper hearths on a rotating plate. One hearth at a time is positioned in line with the E-beam gun. The material to be evaporated is placed directly in the hearth or in an appropriate crucible liner that is placed in the hearth at the proper turret location. A second deposition gauge (not shown) is located near the drum surface, above the crucible. It can measure the amount of material evaporated from the crucible in angstroms per second (Å/sec). Once this is done, the chamber is closed and the vacuum cycle is started. The chamber is evacuated until the pressure gets to at least $6 \times 10^{-5}$ torr.

Once the desired vacuum is achieved, power to the three heaters is turned on. The heaters are set to ramp up to the desired temperature in a 20-minute interval. Measurements are transmitted to a computer file approximately every six seconds. The time, block temperature in three zones (° C.), deposition gauge readings (Å/sec), and current vacuum pressure (torr) are documented. Power is supplied to the E-beam apparatus. It is possible to raise the power to the gun in increments of 0.1%. The power is raised to a point just below evaporation and allowed to soak or condition. After soaking, the power is raised until the desired deposition rate is achieved then a shutter is opened once the polymer begins to deposit. The rotation of the drum is started. The trial ends if either the deposition gauge crystal fails or when all of the material has been evaporated and the deposition gauge reading falls to zero. At the end of the trial, the E-beam shutter is closed, the drum rotation is stopped, the power is disconnected from the E-beam, and the block heater is turned off. After a cool down period, the chamber is opened to atmosphere. The coated material is removed.

Flake Materials Run in E-Beam

The following materials were deposited in the E-beam metallizer and were made into flake materials. They were microphotographed as described below.

| METAL | DEPOSITION RATE (Angstroms/sec) | POWER | THICKNESS TARGET (Angstroms) | COMMENTS |
|---|---|---|---|---|
| Indium Metal | 80 | 10.6% | 475 | Silvery Appearance |
| Magnesium Fluoride | 80 | 7.9% | 475 | Very clear film |
| Silicon Monoxide | 80 | 8.6% | 475 | Brown, Transparent Film |
| Titanium Dioxide | 25 | 10.4% | ~400 | Clear, Iridescent Film |
| Zinc Oxide | 30 | 10.9% | ~200 | Black residue everywhere |
| Aluminum Oxide | 60 | 10.8% | 350 | Clear, slight iridescence |
| Indium Oxide | 60 | 10.1% | 350 | Silvery Film |
| Indium Tin Oxide | 60 | 10.3% | 350 | Silvery Film |
| Chromium Metal Sandwich of SiO/Al/SiO | 60 | 14% | 350 | Chrome colored |
| Silicon Metal | 60 | 12.2% | 350 | Silvery Film |
| Phelly Materials Copper Alloy | 60 | 9.8% | 350 | Copper colored film |
| Copper | (only enough to get a vial of flake) | | | Copper colored flake |

Examples from the above table:

APPENDIX EXAMPLE 1

The following construction was made: A roll of 48 gauge polyester printed with a thermoplastic release coat was metallized in a Temiscal electron beam metallizer with indium. The roll was removed from the metallizer and run through a laboratory stripper using acetone to separate the indium from the polyester. The indium and acetone solution was then decanted and centrifuged to concentrate the flakes. The resulting flakes were than drawn down on a slide and microphotographed on an Image Pro Plus Image Analyzer from Media Cybernetics. The flakes in solution were then reduced in particle size using an IKA Ultra Turex T50 Homogenizer. A particle size distribution was taken on the resulting flake using a Horiba LA 910 laser scattering particle size distribution analyzer. The particle sizes reported below are according to the following conventions: D10: 10% of the particles measured are less than or equal to the reported diameter; D50: 50% of the particles measured are less than or equal to the reported diameter; D90: 90% of the particles measured are less than or equal to the reported diameter. The finished particle size of the flake was D10=3.3, D50=13.2, D90=31.2.

The photograph at page 1 of the Appendix illustrates:

Indium homogenized 30"

Particle size homogenized 30" in microns:

D10=8.21, D50=26.68, D90=65.18

Homogenized 6 minutes 30 seconds.

Finish particle size in microns:

D10=3.33, D50=13.21, D90=31.32

APPENDIX EXAMPLE 2

The following construction was made: A roll of 48 gauge polyester printed with a thermoplastic release coat was metallized in the Temiscal electron beam metallizer with $TiO_2$. The roll was removed from the metallizer and run through a laboratory stripper using acetone to separate the $TiO_2$ from the polyester. The $TiO_2$ and acetone solution was then decanted and centrifuged to concentrate the flakes. The resulting flakes were than drawn down on a slide and microphotographed on an Image Pro Plus Image Analyzer from Media Cybernetics. The flakes in solution were then reduced in particle size using an IKA Ultra Turex T50 Homogenizer. A particle size distribution was taken on the resulting flake before and after homogenization using a Horiba LA 910 laser scattering particle size distribution analyzer.

The photograph at page 2 of the Appendix illustrates:
$TiO_2$ "as is" before particle sizing.
Particle size in microns:
D10=16.20, D50=44.17, D90=104.64
Homogenized 15 minutes.
Finish particle size in microns:
D10=7.83, D50=16.37, D90=28.41

APPENDIX EXAMPLES 3 AND 4

The following construction was made: A roll of 48 gauge polyester printed with a thermoplastic release coat was metallized in the Temiscal electron beam metallizer with $MgF_2$. The roll was removed from the metallizer and run through a laboratory stripper using acetone to separate the $MgF_2$ from the polyester. The $MgF_2$ and acetone solution was then decanted and centrifuged to concentrate the flakes. The resulting flakes were than drawn down on a slide and microphotographed on an Image Pro Plus Image Analyzer from Media Cybernetics. The flakes in solution were then reduced in particle size using an IKA Ultra Turex T50 Homogenizer. A particle size distribution was taken on the resulting flake before and after homogenization using a Horiba LA 910 laser scattering particle size distribution analyzer.

The photographs at pages 3 and 4 of the Appendix illustrate:
$MgF_2$ pictured "as is" before particle sizing.
Particle size in microns:
D10=16.58, D50=150.34, D90=398.17
Homogenized 11 minutes.
Finished particle size in microns:
D10=0.43, D50=16.95, D90=45.92

APPENDIX EXAMPLES 5 AND 6

The following construction was made: A roll of 48 gauge polyester printed with a thermoplastic release coat was metallized in the Temiscal electron beam metallizer with SiO. The roll was removed from the metallizer and run through a laboratory stripper using acetone to separate the SiO from the polyester. The SiO and acetone solution was then decanted and centrifuged to concentrate the flakes. The resulting flakes were than drawn down on a slide and microphotographed on an Image Pro Plus Image Analyzer from Media Cybernetics. The flakes in solution were then reduced in particle size using an IKA Ultra Turex T50 Homogenizer. A particle size distribution was taken on the resulting flake before and after homogenization using a Horiba LA 910 laser scattering particle size distribution analyzer.

The photographs at pages 5 and 6 of the Appendix illustrate:
SiO pictured "as is" before particle sizing.
Particle Size in microns:
D10=17.081, D50=67.80, D90=188.31
Homogenized 17 minutes.
Finished particle size in microns:
D10=5.75, D50=20.36, D90=55.82

APPENDIX EXAMPLES 7, 8 AND 9

The following construction was made: A roll of 48 gauge polyester printed with a thermoplastic release coat was metallized in the Temiscal electron beam metallizer with ZnO. The roll was removed from the metallizer and run through a laboratory stripper using acetone to separate the ZnO from the polyester. The ZnO and acetone solution was then decanted and centrifuged to concentrate the flakes. The resulting flakes were than drawn down on a slide and microphotographed on an Image Pro Plus Image Analyzer from Media Cybernetics. The flakes in solution were then reduced in particle size using an IKA Ultra Turex T50 Homogenizer. A particle size distribution was taken on the resulting flake before and after homogenization using a Horiba LA 910 laser scattering particle size distribution analyzer.

The photographs at pages 7, 8 and 9 of the Appendix illustrate:
ZnO pictured "as is" before particle sizing.
Particle size in microns:
D10=23.58, D50=63.32, D90=141.59
Finished particle size in microns:
D10=7.69, D50=18.96, D90=38.97

APPENDIX EXAMPLES 10, 11 AND 12

The following construction was made: A roll of 48 gauge polyester printed with a thermoplastic release coat was metallized in the Temiscal electron beam metallizer with $Al_2O_3$. The roll was removed from the metallizer and run through a laboratory stripper using acetone to separate the $Al_2O_3$ from the polyester. The $Al_2O_3$ and acetone solution was then decanted and centrifuged to concentrate the flakes. The resulting flakes were than drawn down on a slide and microphotographed on an Image Pro Plus Image Analyzer from Media Cybernetics. The flakes in solution were then reduced in particle size using an IKA Ultra Turex T50 Homogenizer. A particle size distribution was taken on the resulting flake before and after homogenization using a Horiba LA 910 laser scattering particle size distribution analyzer.

The photographs at pages 13 and 14 of the Appendix illustrate:
$Al_2O_3$ pictured "as is" before particle sizing.
Particle Size in microns:
D10=6.37, D50=38.75, D90=99.94
Homogenized 9 minutes.
Finished particle size in microns:
D10=1.98, D50=16.31, D90=39.77)

APPENDIX EXAMPLES 13 AND 14

The following construction was made: A roll of 48 gauge polyester printed with a thermoplastic release coat was metallized in the Temiscal electron beam metallizer with $In_2O_3$. The roll was removed from the metallizer and run through a laboratory stripper using acetone to separate the $In_2O_3$ from the polyester. The $In_2O_3$ and acetone solution was then decanted and centrifuged to concentrate the flakes. The resulting flakes were than drawn down on a slide and microphotographed on an Image Pro Plus Image Analyzer from Media Cybernetics. The flakes in solution were then reduced in particle size using an IKA Ultra Turex T50 Homogenizer. A particle size distribution was taken on the resulting flake before and after homogenization using a Horiba LA 910 laser scattering particle size distribution analyzer.

The photographs at pages 13 and 14 of the Appendix illustrate:

$In_2O_3$ Pictured "as is" before particle sizing.
Particle size in microns:
D10=18.88, D50=50.00, D90=98.39
Homogenized 3 minutes.
Finished particle size in microns:
D10=8.89, D50=20.22, D90=38.92
Relative Refractive Index used: 2.64-2.88

APPENDIX EXAMPLES 15, 16 AND 17

The following construction was made: A roll of 48 gauge polyester printed with a thermoplastic release coat was metallized in the Temiscal electron beam metallizer with indium tin oxide (ITO). The roll was removed from the metallizer and run through a laboratory stripper using acetone to separate the ITO from the polyester. The ITO and acetone solution was then decanted and centrifuged to concentrate the flakes. The resulting flakes were then drawn down on a slide and microphotographed on an Image Pro Plus Image Analyzer from Media Cybernetics. The flakes in solution were than reduced in particle size using an IKA Ultra Turex T50 Homogenizer. A particle size distribution was taken on the resulting flake before and after homogenization using a Horiba LA 910 laser scattering particle size distribution analyzer.

The photographs at pages 15, 16, and 17 of the Appendix illustrate:

ITO pictured "as is" before particle sizing.
Particle size in microns:
D10=21.70, D50=57.00, D90=106.20
Homogenized 6 minutes.
Finished particle size in microns:
D10=10.40, D50=20.69, D90=36.32

APPENDIX EXAMPLES 18, 19, 20 AND 21

The following construction was made: A roll of 48 gauge polyester printed with a thermoplastic release coat was metallized in the Temiscal electron beam metallizer with Si. The roll was removed from the metallizer and run through a laboratory stripper using acetone to separate the Si from the polyester. The Si and acetone solution was then decanted and centrifuged to concentrate the flakes. The resulting flakes were then drawn down on a slide and microphotographed on an Image Pro Plus Image Analyzer from Media Cybernetics. The flakes in solution were than reduced in particle size using an IKA Ultra Turex T50 Homogenizer. A particle size distribution was taken on the resulting flake before and after homogenization using a Horiba LA 910 laser scattering particle size distribution analyzer.

The photographs at Appendix pages 18, 19, 20 and 21 illustrate:

Si pictured "as is" before particle sizing.
Particle size in microns:
D10=20.20, D50=57.37, D90=140.61
Homogenized 20 minutes.
Finished particle size in microns:
D10=11.9, D50=27.0, D90=55.5

APPENDIX EXAMPLES 22 AND 23

The following construction was made: A roll of 48 gauge polyester printed with a thermoplastic release coat was metallized in the Temiscal electron beam metallizer with a sandwich of SiO,Al,SiO. The roll was removed from the metallizer and run through a laboratory stripper using acetone to separate the sandwiches from the polyester. The SiO,Al,SiO and acetone solution was then decanted and centrifuged to concentrate the flakes. The resulting flakes were then drawn down on a slide and microphotographed on an Image Pro Plus Image Analyzer from Media Cybernetics. The flakes in solution were than reduced in particle size using an IKA Ultra Turex T50 Homogenizer. A particle size distribution was taken on the resulting flake before and after homogenization using a Horiba LA 910 laser scattering particle size distribution analyzer.

The photographs at Appendix pages 22 and 23 illustrates:

SiO Al SiO sandwich pictured "as is" before particle sizing
Particle size in microns:
D10=29.7, D50=77.6, D90=270.2

APPENDIX EXAMPLES 24 AND 25

The following construction was made: A roll of 48 gauge polyester printed with a thermoplastic release coat was metallized in the Temiscal electron beam metallizer with chromium. The roll was removed from the metallizer and run through a laboratory stripper using acetone to separate the chromium from the polyester. The chromium and acetone solution was then decanted and centrifuged to concentrate the flakes. The resulting flakes were then drawn down on a slide and microphotographed on an Image Pro Plus Image Analyzer from Media Cybernetics. The flakes in solution were than reduced in particle size using an IKA Ultra Turex T50 Homogenizer. A particle size distribution was taken on the resulting flake before and after homogenization using a Horiba LA 910 laser scattering particle size distribution analyzer.

The photographs at Appendix 24 and 25 illustrate:

Chromium pictured "as is" before particle sizing
Particle size in microns:
D10=13.1, D50=8.9, D90=59.8
Homogenized 3 minutes
Finished particle size in microns:
D10=9.82, D50=19.81; D90=37.55

APPENDIX EXAMPLE 26

The following construction was made: A roll of 48 gauge polyester printed with a thermoplastic release coat was metallized in the Temiscal electron beam metallizer with an M-401 copper, zinc, silver alloy, Phelly Materials, Emerson, N.J. The roll was removed from the metallizer and run through a laboratory stripper using acetone to separate the alloy from the polyester. The alloy and acetone solution was then decanted and centrifuged to concentrate the flakes. The resulting flakes were then drawn down on a slide and microphotographed on an Image Pro Plus Image Analyzer from Media Cybernetics. The flakes in solution were than reduced in particle size using an IKA Ultra Turex T50 Homogenizer. A particle size distribution was taken on the resulting flake before and after homogenization using a Horiba LA 910 laser scattering particle size distribution analyzer.

The photograph at Appendix page 26 illustrates:
Alloy pictured "as is" before particle sizing
Particle size in microns:
D10=69.6, D50=161.2, D90=313.4
Homogenized 20 minutes
Finished particle size in microns:
D10=13.32, D50=27.77, D90=51.28

FIGS. 13 and 14 show a vacuum chamber, rotating drum and polymer vapor chamber similar to FIGS. 11 and 12, except that the polymer is delivered to the chamber by a wire feed mechanism 136 described in more detail below. In this embodiment, the heater block has small holes in both ends that allow a coated wire 143 to pass into the heated slot area. The coated wire is unwound from a spool 164 and advanced at a predetermined rate through the block where the polymer is evaporated into the slot area then the spent wire is rewound on a second spool 166. The slot is open into a cavity running through the center of the block. In this embodiment, the area around the heater block and drum is pumped to selectively cool that area for condensing the polymers coated on the wire. This prevents escape of vapor toward the E-beam area of the chamber.

APPENDIX EXAMPLE 27

Example: Drum with Polymer Block and E-Beam (wire feed):

| Release Material | Styron | Support Material | Aluminum |
|---|---|---|---|
| Supplier | Dow | Supplier | Mat. Research Corp |
| No. | 685D | No. | 90101E-AL000-30002 |

| PVD Conditions: | | | | | | | |
|---|---|---|---|---|---|---|---|
| E-Beam Power | Release Thickness (Angstroms) | Support Thickness | Drum Speed | Revolutions | Wire Size | Coat Weight | Wire Speed |
| 15% | 200 | 150 Angstroms | 1 RPM | 100 | 0.005 in./dia | 0.0005 gms/in | 6 |

The following construction was made at the conditions shown above: 48 gauge polyester wrapped around the drum for easy removal was polymer release coated with styrene and metallized in the Temiscal electron beam metallizer with alumi num. The polyester film was removed from the metallizer and run through a laboratory releasing device using acetone to separate the aluminum from the releasing layers and the polyester film. The aluminum and acetone solution was then decanted and centrifuged to concentrate the flakes. The resulting flakes were than drawn down on a slide and microphotographed on an Image Pro Plus Image Analyzer from Media Cybernetics. The flakes in solution were then reduced in particle size using an IKA Ultra Turex T50 Homogenizer. A particle size distribution was taken on the resulting flake using a Horiba LA 910 laser scattering particle size distribution analyzer.

The photographs at page 27 of the Appendix illustrates:

Starting Particle size

D10=13.86, D50=34.65, D90=75.45.

Homogenized

Finished particle size in microns D105.10, D50=13.19, D90=25.80

APPENDIX EXAMPLE 28

Example: Drum with Polymer Block and E-Beam (wire feed):

| Release Material | Styron | Support Material | Silicone Dioxide |
|---|---|---|---|
| Supplier | Dow | Supplier | Cerac |
| No. | 685D | No. | S-1060 |

| PVD Conditions: | | | | | | | |
|---|---|---|---|---|---|---|---|
| E-Beam Power | Release Thickness (Angstroms) | Support Thickness | Drum Speed | Revolutions | Wire Size | Coat Weight | Wire Speed |
| 8% | 200 | 200 Angstroms | 1 RPM | 100 | 0.005 in./dia | 0.0005 gms/in | 6 |

The following construction was made at the conditions shown above: 48 gauge polyester wrapped around the drum for easy removal was polymer release coated with styrene and metallized in the Temiscal electron beam metallizer with silicone monoxide. The polyester film was removed from the metallizer and run through a laboratory releasing device using acetone to separate the silicon monoxide from the releasing layers and the polyester film. The silicon monoxide and acetone solution was then decanted and centrifuged to concentrate the flakes. The resulting flakes were then drawn down on a slide and microphotographed on an Image Pro Plus Image Analyzer from Media Cybernetics.

The flakes are shown in the photograph in Appendix page 28.

APPENDIX EXAMPLE 29

Example: Drum with Polymer Block and E-Beam (wire feed):

| Release Material Supplier No. | Styron Dow 685D | Support Material Supplier No. | Magnesium Fluoride Cerac M-2010 | | | | |
|---|---|---|---|---|---|---|---|
| PVD Conditions: | | | | | | | |
| E-Beam Power | Release Thickness (Angstroms) | Support Thickness | Drum Speed | Revolutions | Wire Size | Coat Weight | Wire Speed |
| 7.5% | 200 | 200 Angstroms | 1 RPM | 100 | 0.005 in./dia | 0.0005 gms/in | 6 |

The following construction was made at the conditions shown above: 48 gauge polyester wrapped around the drum for easy removal was polymer release coated with styrene and metallized in the Temiscal electron beam metallizer with magnesium fluoride. The polyester film was removed from the metallizer and run through a laboratory releasing device using acetone to separate the magnesium fluoride from the releasing layers and the polyester film.

The magnesium fluoride and acetone solution was then decanted and centrifuged to concentrate the flakes. The resulting flakes were than drawn down on a slide and microphotographed on an Image Pro Plus Image Analyzer from Media Cybernetics.

The flakes are shown in the photograph at Appendix page 29.

Drum with Vapor Tube and E-beam (Wire Feed)

Figure 16:
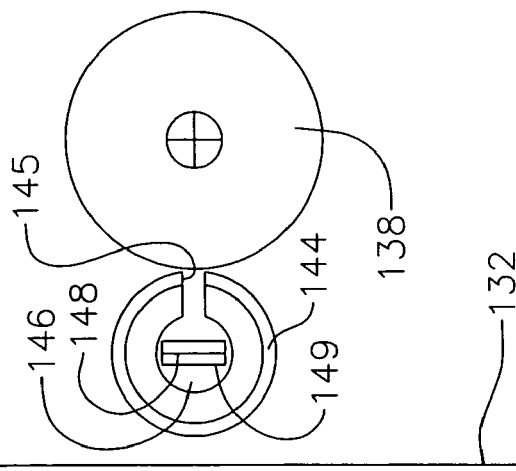
FIG. 16 is a side elevational view of a heated polymer vapor tube and rotating drum shown in FIG. 15.

FIGS. 15, 16, 15A and 16A show two separate embodiments of a wire feed mechanism for delivering coated polymer to a vacuum chamber which includes a rotating drum, a deposition gauge, a polymer vapor tube with a coated polymer coated wire feed system, and an electron beam (E-beam) gun. The drum is as described previously. The vapor tube is equipped with a heated polymer vapor path surrounded by a water-cooled tube separated by a vacuum gap. A slot in the tubes allows the evaporated polymer to pass through to the drum surface. The vapor tube produces a differential pressure area adjacent the heater block and drum for preventing escape of vapor to the E-beam area of the chamber. In the embodiment shown in FIGS. 15 and 16, the wire feed housing contains a wire supply spool and a take-up spool. The wire is unwound and coated with polymer and runs around the heater block. Polymer is evaporated from the coated wire and is directed onto the drum surface. The end view of FIG. 16 shows the outer tube with its slot facing the drum. The outer tube is cooled and the vapor tube inside is heated. This view also shows the heater block with the wire wrap. The wire passes into the vapor tube, around the heated tube and back out to the take-up spool.

Figure 15:
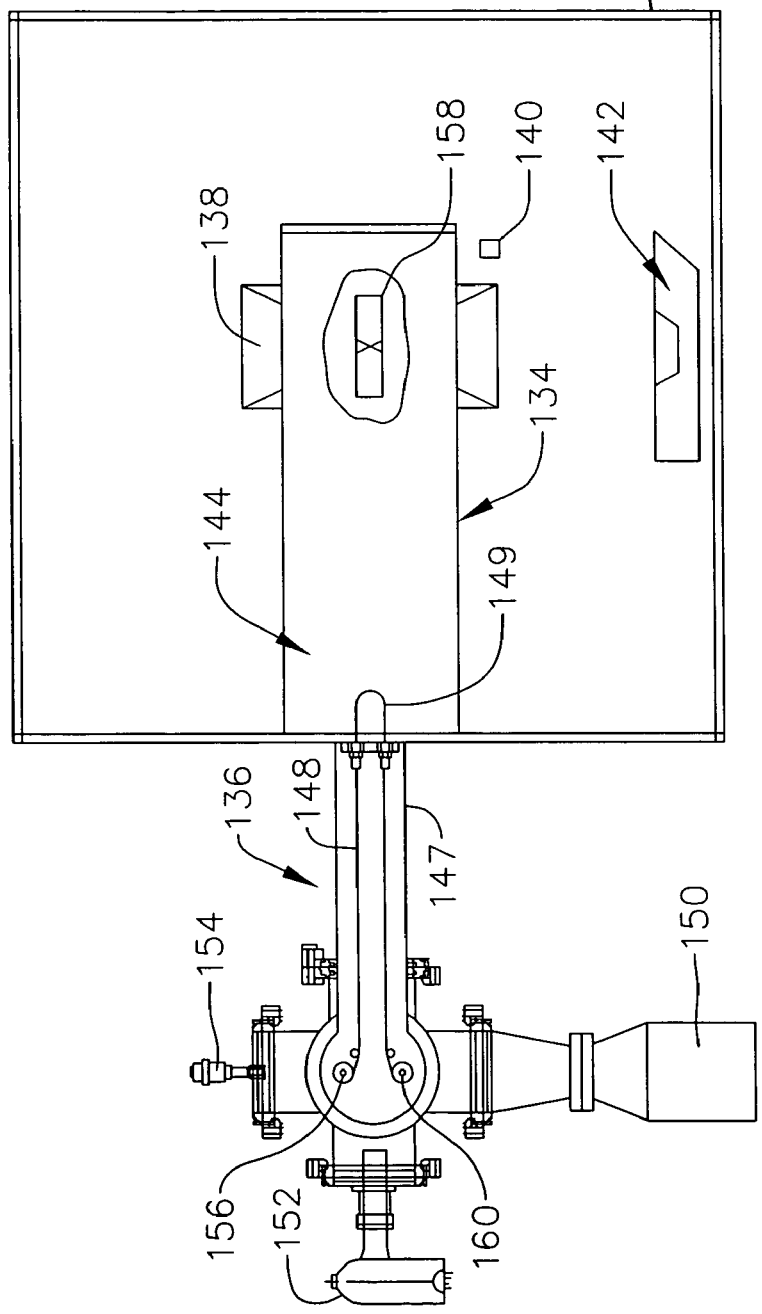
FIG. 15 is one embodiment of a wire feed mechanism and vapor tube combination for delivering polymer release coat material to a vacuum chamber.

The embodiment of FIGS. 15 and 16 shows a vacuum chamber 132 and heater block 134 similar to those previously described, except that polymer for the release layers is fed into the vacuum chamber via the coated wire feed apparatus 136. The vacuum chamber includes a rotating drum 128, a deposition gauge 140 and an electron beam (E-beam) gun 142. As mentioned previously, the drum is approximately one foot in diameter and six inches wide on the surface. It can rotate at a maximum speed of two rotations per minute. The heater block 134 comprises a heated polymer vapor chamber 144 which is cylindrical in shape with a slot 145 carved into one area. The heated inner tube is shown at 146. The wire feed apparatus 136 includes an elongated housing 147 containing a wire 148 which is coated with polymer and then fed into the heater block. The wire wraps around a heated shoe 149. The wire feed apparatus also includes a turbo pump 150, an ion gauge and a thermocouple gauge 154. The coated wire is unwound from a spool 156 and advanced at a predetermined rate through the heater block where the polymer is evaporated into the slot area 158 and then the spent wire is rewound on a second spool 160. The slot is open into a cavity running through the center of the heater block. The pump assists in delivering vaporized polymer to the drum surface. The heater block has three independent heaters that can be used to control the temperature of the block. The deposition gauge 140 is placed approximately one inch in front of the slot. It can measure the amount of material passing through the slot in angstroms per second (Å/sec).

In use, the drum is covered with PET film. The wire feed mechanism and heater block are used to coat a layer of polymeric release material on the carrier, followed by activating the E-beam gun to coat a layer of metal or other material on the release coat, and so on. The E-beam gun 142 is typical of those used in the industry. It has four copper hearths on a rotating plate. One hearth at a time is positioned in line with the E-beam gun. The material to be evaporated is placed directly in the hearth or in an appropriate crucible liner that is placed in the hearth at the proper turret location. A second deposition gauge (not shown) is located near the drum surface, above the crucible. It can measure the amount of material evaporated from the crucible in angstroms per second (Å/sec). Once this is done, the chamber is closed and the vacuum cycle is started. The chamber is evacuated until the pressure gets to at least $6 \times 10^{-5}$ torr.

Once the desired vacuum is achieved, power to the three heaters is turned on. The heaters are set to ramp up to the desired temperature in a 20-minute interval. Measurements are transmitted to a computer file approximately every six seconds. The time, block temperature in three zones (° C.), deposition gauge readings (Å/sec), and current vacuum pressure (torr) are documented. Power is supplied to the E-beam apparatus. It is possible to raise the power to the gun in increments of 0.1%. The power is raised to a point just below evaporation and allowed to soak or condition. After soaking, the power is raised until the desired deposition rate is achieved then a shutter is opened and the polymer coated wire mechanism is set to the desired rate and deposition of polymer begins. The rotation of the drum is started. At the end of the trial, the E-beam shutter is closed, the drum rotation is stopped, the power is disconnected from the E-beam, the block heater and wire feed is turned off. After a cool down period, the chamber is opened to atmosphere. The coated material is removed.

In the embodiment shown in FIGS. 15A and 16A, the vapor tube has small holes in both ends that allow the coated wire 162 to pass into a heated block in the vapor tube. The coated wire is unwound from a first spool 164 and advanced at a predetermined rate through the tube where the polymer is evaporated into the slot area 158 and then the spent wire is rewound on a second spool 166. The vapor tube walls are heated by strip heaters and the block has an independent heater that can be used to control the temperature of the system. A deposition gauge 168 is placed approximately one inch in front of the slot. It can measure the amount of material passing through the slot in angstroms per second (Å/sec).

The drum is covered with PET film. The E-beam gun has four copper hearths on a rotating plate. One hearth at a time is positioned in line with the E-beam gun. The material to be evaporated is placed directly in the hearth or in an appropriate crucible liner that is placed in the hearth at the proper turret location. A second deposition gauge (not shown) is located near the drum surface, above the crucible. It can measure the amount of material evaporated from the crucible in angstroms per second (Å/sec). Once this is done, the chamber is closed and the vacuum cycle is started. The chamber is evacuated until the pressure gets to at least $6\times10^{-5}$ torr. Once the desired vacuum is achieved, power to the tube and block heaters is turned on. The heaters are set to ramp up to the desired temperature in a 20-minute interval. Measurements are transmitted to a computer file approximately every six seconds. The time, block temperature in three zones (° C.), deposition gauge readings (Å/sec), and current vacuum pressure (torr) are documented. Power is supplied to the E-beam apparatus. It is possible to raise the power to the gun in increments of 0.1%. The power is raised to a point just below evaporation and allowed to soak or condition. After soaking, the power is raised until the desired deposition rate is achieved then a shutter is opened and the polymer coated wire mechanism is set to the desired rate and deposition of polymer begins. The rotation of the drum is started. At the end of the trial, the E-beam shutter is closed, the drum rotation is stopped, the power is disconnected from the E-beam, the tube, block heater and wire feed is turned off. After a cool down period, the chamber is opened to atmosphere. The coated material is removed.

APPENDIX EXAMPLE 30

Example: Drum with Vapor Tube and E-Beam (wire feed):

| Release Material | Styron | Support Material | Aluminum |
|---|---|---|---|
| Supplier | Dow | Supplier | Mat. Research Corp. |
| No. | 685D | No. | 90101E-AL000-30002 |

| PVD Conditions: | | | | | | | |
|---|---|---|---|---|---|---|---|
| E-Beam Power | Release Thickness (Angstroms) | Support Thickness | Drum Speed | Revolutions | Wire Size | Coat Weight | Wire Speed |
| 20% | 200 | 150 Angstroms | 1 RPM | 100 | 0.005 in./dia | 0.0005 gms/in | 6 |

The following construction was made at the conditions shown above: 48 gauge polyester wrapped around the drum for easy removal was polymer release coated with styrene and metallized in the Temiscal electron beam metallizer with aluminum. The polyester film was removed from the metallizer and run through a laboratory releasing device using acetone to separate the aluminum from the releasing layers and the polyester film. The aluminum and acetone solution was then decanted and centrifuged to concentrate the flakes. The resulting flakes were drawn down on a slide and microphotographed on an Image Pro Plus Image Analyzer from Media Cybernetics. The flakes in solution were then reduced in particle size using an IKA Ultra Turex T50 Homogenizer. A particle size distribution was taken on the resulting flake using a Horiba LA 910 laser scattering particle size distribution analyzer. The finished particle size of the flake was D10=3.3, D50=13.2, D90=31.2.

The photograph at page 30 of the Appensix illustrates:

Aluminum pictured homogenized 30"

Particle size homogenized 30" in microns: D10=8.21, D50=26.68, D90=65.18

Homogenized 6 minutes 30 seconds.

Finish particle size in microns D10=3.33, D50=13.21, D90=31.32

Example: Drum with Vapor Tube and E-Beam (wire feed) Nanoparticles:

| Release Material Supplier No. | Styron Dow 685D | Support Material Supplier No. | Aluminum Mat. Research Corp. 90101E-AL000-30002 | | | | |
|---|---|---|---|---|---|---|---|
| PVD Conditions: | | | | | | | |
| E-Beam Power | Release Thickness (Angstroms) | Support Thickness | Drum Speed | Revolutions | Wire Size | Coat Weight | Wire Speed |
| 17% | 200 | 3 Angstroms | 2.2 RPM | 100 | 0.005 in./dia | 0.0005 gms/in | 6 |

The following construction was made at the conditions shown above: 48 gauge polyester wrapped around the drum for easy removal was polymer release coated with styrene and metallized in the Temiscal electron beam metallizer with aluminum. The polyester film was removed from the metallizer and run through a laboratory releasing device using acetone to separate the aluminum from the releasing layers and the polyester film. The resulting aluminum particle slurry was saved in a vial for further study.

The goal of the trial was to achieve nanoparticles of aluminum resulting from managing the deposition process such that as the aluminum is deposited on the releasing layer it remains in the island growth state. These islands of uncoalesced aluminum are then coated with releasing material then recoated with islands of aluminum. This is repeated until a 100 multilayer sandwich of release/aluminum islands/release is formed.

Drum with Polymer Block & E-Beam (Melt Pump Extruder)

Figure 18:
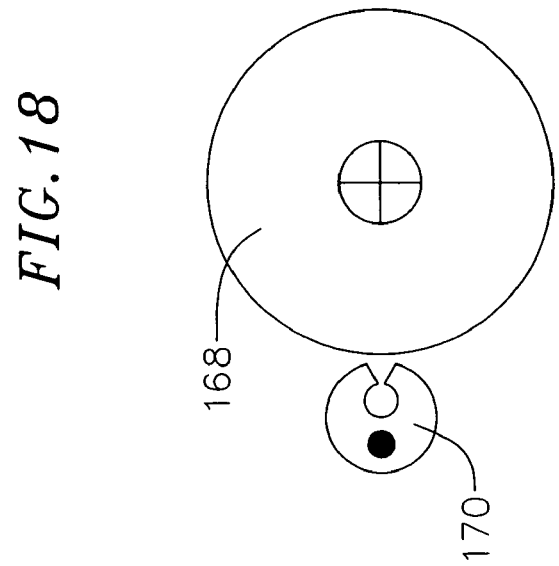
FIG. 18 is a side elevational view showing a heated polymer vapor tube and rotating drum illustrated in FIG. 17.
Figure 17:
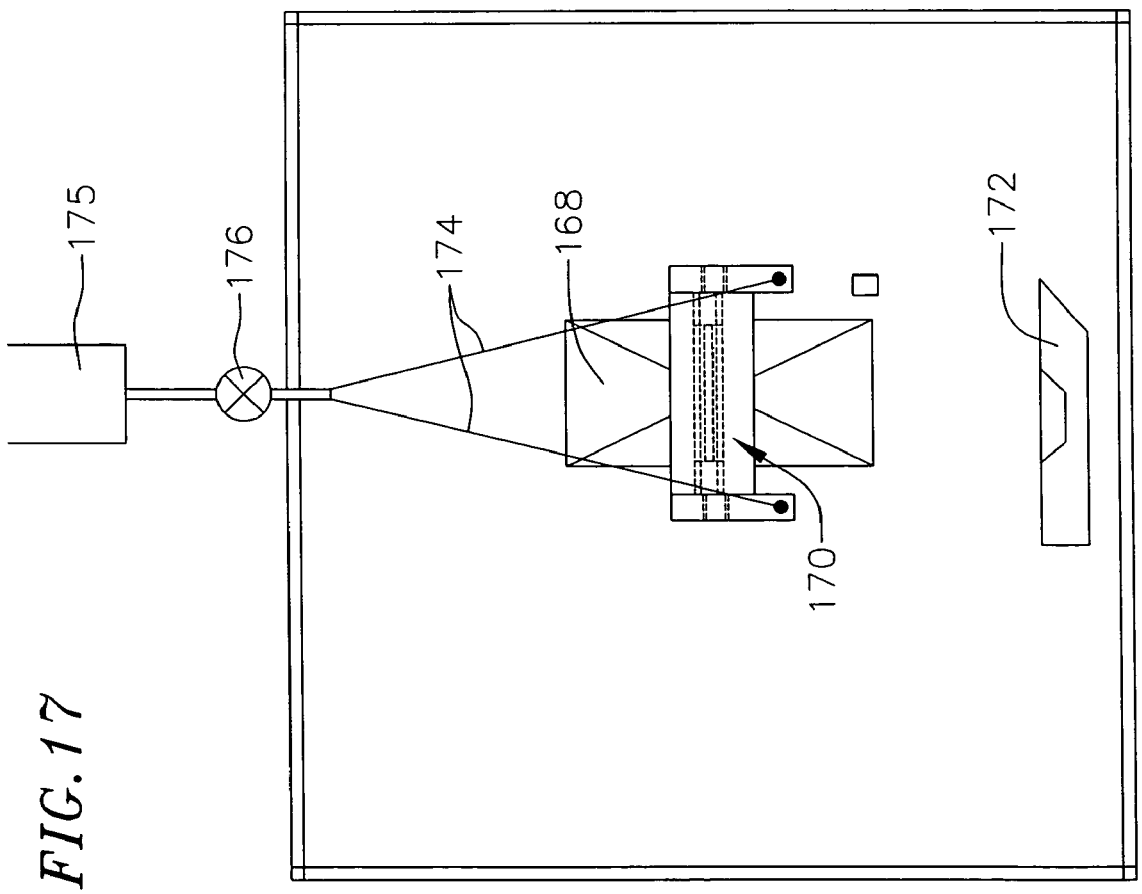
FIG. 17 is a semi-schematic side elevational view illustrating a heated melt tube apparatus for delivering polymeric base coat material to a vacuum chamber.

Referring to FIGS. 17 and 18, a vacuum chamber and heater block similar to those described above is modified to deliver molten polymer (thermoplastic polymer used as a release coat material) to the vacuum chamber. The vacuum chamber includes the rotating drum 168, a deposition gauge, the stainless steel heater block 170, and an electron beam (E-beam) gun 172. The drum is approximately one foot in diameter and six inches wide on the surface. The drum can be rotated and the speed and number of revolutions monitored. The heater block slot is open into a cavity running through the center of the block. The block has three independent heaters used to control the temperature of the block. The block is fed molten polymer by two heated capillary tubes 174 connected to the polymer crucibles located in each end or the block. These tubes are connected to a melt pump located outside of the chamber. It is fed by a nitrogen blanketed melt vessel 175 containing conditioned polymer and an extruder 176. A deposition gauge placed approximately one inch in front of the slot measures the amount of material passing through the slot in angstroms per second (Å/sec).

To add material, polymer is pumped to cavities in each end of the heater block. The drum is covered with PET film. The E-beam gun has four copper hearths on a rotating plate. One hearth at a time is positioned in line with the E-beam gun. The material to be evaporated is placed directly in the hearth or in an appropriate crucible liner placed in the hearth at the proper turret location. A second deposition gauge is located near the drum surface, above the crucible. It measures the amount of material evaporated from the crucible in angstroms per second (Å/sec). Once this is done, the chamber is closed and the vacuum cycle is started. The chamber is evacuated until the pressure reaches at least $6 \times 10^{-5}$ torr. Once the desired vacuum is achieved, power to the three heaters is turned on. The heaters are set to ramp up to the desired temperature in a 20 minute interval. Measurements are transmitted to a computer file approximately every 6 seconds. The time, block temperature in three zones (° C.), deposition gauge readings (Å/sec), and current vacuum pressure (torr) are documented. Power is supplied to the E-beam apparatus. It is possible to raise the power to the gun in increments of 0.1%. The power is raised to a point just below evaporation and allowed to soak or condition. After soaking, the power is raised until the desired deposition rate is achieved and then a shutter is opened once the polymer begins to deposit. Rotation of the drum is started and the melt pump is set to the desired rate. The trial ends if either the deposition gauge crystal fails or when all of the material has been evaporated and the deposition gauge reading falls to zero. At the end of the trial, the E-beam shutter is closed, drum rotation is stopped, the melt pump is stopped, the power is disconnected from the E-beam, and the block heater is turned off. After a cool down period, the chamber is opened to atmosphere. The coated material is removed.

Release-Coated Carrier Film Process

Figure 19:
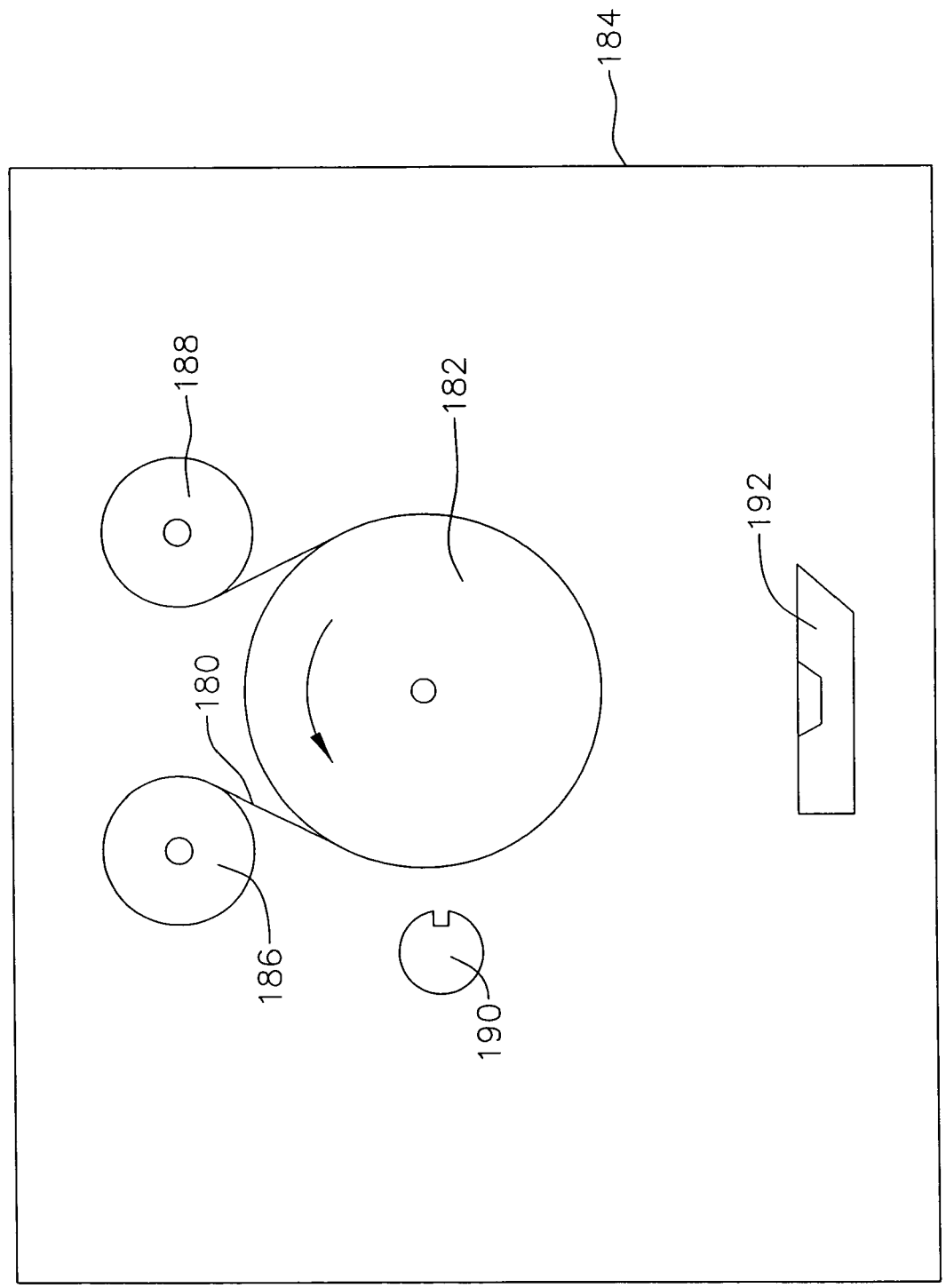
FIG. 19 is a semi-schematic side elevational view illustrating a process for making carrier sheet material with a polymeric release coat according to principles of this invention.

In one embodiment, the present invention can be used for manufacturing release-coated polymeric carrier film such as release-coated polyester (PET). Referring to FIG. 19, a polyester carrier film 180 is wrapped around a rotating cooling drum 182 contained in a vacuum chamber 184. The film passes from a film unwind station 186 around approximately 300° or more of surface area of the rotating cooling drum, and the coated film is then taken up at a film rewind station 188. A polymer delivery source 190 directs the polymer material toward the carrier film and the E-beam 192 gun vaporizes the polymer for coating it onto the carrier film. The polymeric coating hardens and is then taken up at the rewind station. The process provides a thermoplastic polymeric release-coated heat-resistant polymeric carrier film, in which the film provides good release properties for flake material applied to the film by vapor deposition techniques in a vacuum chamber. The film provides effective release in forming thin flat angstrom level flakes.

Polystyrene Trials

From trials in the electron beam metallizer, it was discovered that the heater block temperature had a significant effect on the condition of the polystyrene after it was evaporated and deposited. For all trials, the Dow 685D polystyrene was used as deposition material. This material has a molecular weight (MW) of roughly 300,000.

Trials were run with heater block temperatures ranging from 300° C. to 375° C. in 25° C. increments. The rate at which the block was heated was varied, but did not seem to have as significant effect as the eventual temperature. All trials were run according to the Drum with Block Procedure described above.

In the first trial, the block was loaded with 10 pellets of the Dow 685D polystyrene. The temperatures on the heaters were set for 300° C. At that temperature, there is minimal deposition. Gauge readings ranged from 5-10 Å/sec. At the end of the trial there was very little apparent residue.

In the next trial, the block was set to reach a temperature of 325° C. Deposition increased into the 20-30 Å/sec range. At the end of the trial, there was a noticeable film deposited. The film was clear in color and was solid with no tackiness.

Next the block was programmed to reach 350° C. The deposition rates were similar to that in the trial to 325° C. At the end of the trial, the film was different than the film that was formed in the previous trial. The film in this trial was tackier to the touch and there appeared to be a slight discoloration.

Finally, the block was set for a temperature ramp to 375° C. Deposition rates increased to a rate of nearly 40 Å/sec. At the end of the trial, yellowish oil was left on the film. The oil was easily wiped away, but there was no sign of clear polystyrene film beneath it.

From these trials it was concluded that above 350° C. polystyrene begins to degrade. This confirms values that were found in the literature. At temperatures greater than 350° C., the polystyrene evaporates and then appears to depolymerize and leave a residue of nearly pure styrene monomer. This was confirmed by FTIR analysis of the residue.

In further study, samples of the Dow polystyrene were sent to an outside lab for analysis. A method was devised to determine what was evaporating from the polymer as the temperature was raised to a desired operating temperature. Using a "Direct Insertion Probe" method coupled with GC-MS analysis, the temperature was set to ramp to 325° C. at a rate of 30° C./min. Once the maximum temperature was reached, it was held for 10 minutes.

An ion counter in the apparatus indicated when material was being evaporated from the solid pellet. Two peaks appeared during the trial, one at approximately 260° C. and another at 325° C. GC-MS analysis was performed on these two peaks. The first peak showed large concentrations of low molecular weight species including, but not limited to, monomers and dimers of polystyrene. The second peak does not show nearly as many volatiles in its GC-MS analysis. From this analysis it was concluded that upon first heating, a large quantity of unpolymerized material and many other low molecular weight volatiles are liberated from the bulk polystyrene. After prolonged heating, the desired polymer is evaporated and deposited onto the desired surface. I was concluded that for optimum performance, the bulk polymer needs to be preheated or otherwise conditioned to remove as much "low end" material as possible.

In another experiment, we used the same Direct Insertion Probe method to try to gain further insight into what is happening in the first peak seen in the first experiment. In this trial the applied heat was ramped up to 260° C. and held the temperature. This is where the peak appeared in the first trial. The purpose was to characterize what was being evaporated at this point by GC-MS and also see if the material could be removed from the bulk material by a preheating step.

The peak appeared in approximately the same place and GC-MS showed a large assortment of low molecular weight species. These included some trace of the styrene monomer, but there were numerous other organic fragments present. After a period of about 10-12 minutes, the peak had disappeared. This indicated that the volatile material had been removed from the bulk material and a strategy of preheating should be effective in forming clean polymer films. From this series of tests new procedures were developed to increase the effectiveness of depositing polystyrene film with the Dow 685D polymer. First, the bulk material is heated to a temperature of 260-300° C. During this preheating, the film should be covered so as not to allow the low end products to reach the web. This step may also be done outside the vacuum or at least outside of the deposition chamber so that contamination can be minimized. After sufficient time, the temperature should then be raised to 325° C. This temperature provides the highest deposition rate without causing degradation of the polystyrene.

Further observations came from running similar experiments with other polystyrene samples. In this case we used a 4,000 MW and a 290,000 MW polystyrene supplied by Pressure Chemical. These samples are polystyrene standards and have very narrow molecular weight distributions. They are also free of most contaminants that would be found in most commercial polymers. From these experiments we made the following conclusions. The use of the 4,000 MW material has less of an impact on the vacuum pressure than the 290,000 MW material. The pressure rises more when the higher molecular weight material is used. This is consistent with data we found during trials in the bell jar. We also observed that the 290,000 MW material began deposition at a lower temperature than the 4,000 MW material. We confirmed this by running TGAs on both materials. The TGAs showed that the 4,000 MW material does indeed show a weight loss beginning at a higher temperature than that observed for the 290,000 MW polymer.

Polymer Conditioning

Before the polymer can be used in a deposition process, it must be conditioned to remove moisture and low molecular weight material from the bulk polymer. Using the Dow 685D polystyrene, we accomplished this in a two stage conditioning process. In the first stage, a quantity of the polystyrene is placed in a vacuum oven and held at 225° C. for 16 hours. This temperature is high enough to drive off most moisture in the polymer. This temperature is also chosen because it is below the point where polymer degradation is seen. In trials run at 275° C., the polystyrene sample showed significant degradation after the 16 hour conditioning period. After the conditioning period, the polymer is removed and placed in a desiccator so that it does not take on any moisture while it is cooling.

The second stage of the conditioning is done when the polymer is ready to be used in the metallizer. It is removed from the desiccator and immediately placed in the metallizer so that moisture gain is minimized. Before deposition begins, the polymer block containing the first stage conditioned polymer is heated to 275° C. and held at that temperature for 20 minutes. At this temperature, any remaining moisture is driven off and the low molecular weight material in the polymer is also removed. This low molecular weight material will include unreacted monomer and many other impurities found in the bulk polystyrene. After holding at 275° C. for the necessary conditioning time, the polymer should be ready for deposition.

By utilizing this two stage conditioning process, the final film should be of a consistent molecular weight and it should also be free of most low molecular weight impurities. This should provide for a much more consistent and reliable film.

Reuse of Solvent & Polymer

When the current release coat is stripped and the flake is collected the spent solvent along with the dissolved release coat is sent through a distillation process to reclaim the solvent. When the solvent is reclaimed the still bottoms are sent out to be disposed of as hazardous waste. In this experiment we attempted to reuse the still bottoms as a release coat. The still bottoms as collected were 24% NVM. This material was reduced to 8.3% NVM with three parts IPAC and one part NPAC. This lacquer was than drawn down on 2 mil polyester using a #2 Meyer rod. The resulting coating was clear with a coat weight of 0.3 grams per meter square. The draw down was than metallized with aluminum in the bell jar metallizer. The resulting aluminum layer had an optical density of 2 to 2.5 as measured on the Macbeth densitometer.

The resulting construction was than dissolved in acetone taking 30 seconds to release from the polyester. The flake was than drawn down on a slide and analyzed. Flake produced by this method was in the 400 to 600 micron range with a smooth surface and was indistinguishable from the current product.

Wire Coating

Figure 20:
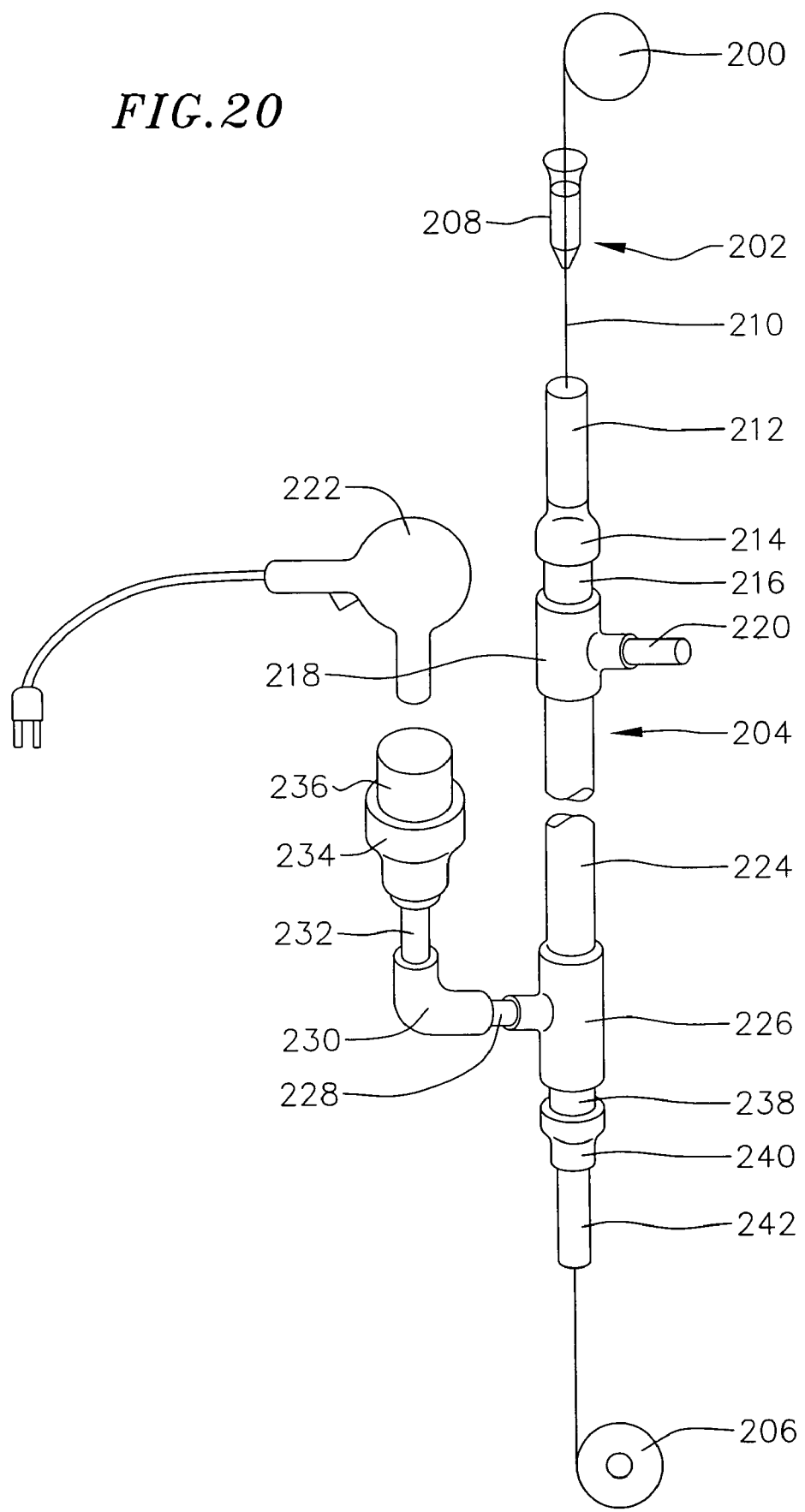
FIG. 20 is a semi-schematic elevational view showing a melt pump process for delivering polymer release material to a vacuum chamber.

FIG. 20 illustrates a wire coating apparatus for coating polymer onto the wire used in the wire feed embodiments described previously.

Materials:

A mixture of fully dissolved Dow 685 polystryene polymer in xylene.

Dow 685 45 pts by wt
Xylene 55 pts by wt

Bare Nickel/Chromium wire 0.005 inch in gage from Consolidated Electronic Wire and Cable.

Description of Apparatus:

Referring to FIG. 20, the coating apparatus consists of four sections: unwind 200, coating body 202, drying tube 204, and winder 206. The spool of wire is restricted in side to side movement while allowing it to unwind with a minimum of resistance. The coating body comprises a syringe body 208, Becton Dickson 5 cc disposable syringe, and a syringe needle 210, Becton Dickson 20GI Precision Glide needle. The disposable syringe is filled with the coating mixture and the needle meters a given amount of material onto the wire. The drying tube is constructed from copper plumbing tubing. From top to bottom the tube consists of a ½ inch tube 212 six inches long, a ½ to ¾ reducer 214, a ¾ inch tube 216 two inches long, a ¾ inch tee 218 from which a 4 inch ¾ inch tube 220 extends perpendicularly. An exhaust fan 222 is attached to this pipe drawing air from the apparatus. The straight section of the tee is attached to a ¾ inch copper tube 224 five feet long. This section is the drying section of the apparatus. Another ¾ inch tee 226 is attached to the 5 foot section. The perpendicular tee is attached to a three inch ¾ inch tube 228 connected to a 90 degree elbow 230 turned upwards. To this elbow is attached a 1½ inch tube 232 and a ¾ inch threaded connector 234. This connector is attached to a two inch to ¾ inch black iron reducer. A two inch pipe 236 five inches long is screwed into this reducer. The two inch pipe holds the barrel of the hot air gun. The vertical section of the tee is attached to a two inch ¾ inch tube 238, then reduced at 240 to ½ inch. A final six inch section of ½ inch tubing 242 is attached.

Description of Coating Application:

Using the apparatus displayed above the coating is applied to the wire. The wire is unwound from the spool and fed though a syringe body that contains the mixture of polystyrene polymer and solvent. As the wire is drawn down the syringe body through the syringe needle the wire is covered with the mixture. The coated wire is fed through a copper tube through which heated air is passed. Air is drawn from an exit port in the top of the tube at a rate greater than heated air is supplied from a port in the bottom of the tube. The extra air required by the exhaust port is supplied at the ends of the tube where the wire enters and exits. The amount of hot air supplied to the tube was controlled through the use of a rheostat. It was found 85% of full output was the preferred temperature. Greater temperature caused the coating to blister, less temperature detracted from drying. The wire was wound on a spool after passing through the drying tube. The desired feed rate of the wire was 22 inches per minute through the drying tube. The speed of the winding spool was controlled manually using another rheostat. As more wire was wound onto the spool the rheostat setting was dropped to compensate for the faster pull of the wire during winding. Final coating on the wire was in the 0.4 to 0.5 mg/inch range.

DOW STYRON 685D

Sample Preparation and Analysis:

About 75 milligrams of the polystyrene resin from each plastic container was separately dissolved in 10 mL of tetrahydrofuran (THF) and tumbled for about 3 hours. Each THF solution was filtered through 0.45 μm PTFE filter and placed in an autosampler vial.

The GPC instrument was a Waters 2690 pumping system with a Waters 410 refractive index detector. The columns were three Plgel Mixed-C 300 mm×7.5 from Polymer Labs. The mobile phase was THF at 1.0 mL/min. The injection size was 50 μL. Calibration was against a set of twelve polystyrene standards obtained from Polymer Labs, ranging from 580 to 1,290,000 Da. Millennium version 3.2 software from Waters was used with the GPC option. Calibration was done daily and a check sample of SRM 706 polystyrene from the National Institute for Standards and Technology was also analyzed daily with each batch of samples.

Results:

The calculated value for the molecular weight distribution of the soluble polymer portion of the sample is shown in the following table. The values for the peak molecular weight (Mp), number average molecular weight (Mn) and weight average molecular weight (Mw) are expressed as thousands to give the correct number of significant figures. Quality control data indicate that a relative difference of ten percent for Mn and five percent for Mw are not significant.

| Sample | Mp | Mn | Mw | Dispersity |
|---|---|---|---|---|
| STYRON 685D | 266 k | 107 k | 313k | 2.94 |
| STYRON 685D duplicate | 272 k | 138 k | 320 k | 2.32 |
| STYRON 685D average | 269 k | 123 k | 317 k | 2.63 |

Polystyrene Polymer Characterization Data from Pressure Chemical Co.

| Nominal 290,000 MW Styrene | |
|---|---|
| By Lalls: | $M_w = 287,000$ |
| By Size Exclusion Chromatography | $M_w = 288,800$ |
| 1×60 cm Plgel 5 micron mixed gel | $M_n = 274,600$ |
| THF @ 1 ml/min. 20 ml. @ 0.02% | $M_p = 293,000$ |

-continued

| | |
|---|---|
| By Intrinsic Viscosity:<br>Toluene @ 30° C. | $M_v = 288,800$ |
| $M_v$ calculated from (h) = $12 \times 10 - {}^5M^0.71$<br>Nominal 4,000 MW Styrene | (h) = 0.904 |
| By Vapor Pressure Osmometer:<br>THF, 38 C., four concentrations 08 membrane | $M_n + 3,957$ |
| By Size Exclusion Chromatography: | $M_w = 4,136$<br>$M_n = 3,967$<br>$M_p = 4,000$ |
| By Intrinsic Viscosity: | $M_v = 4,075$ |
| THF @ 30° C.<br>$M_v$ calculated from (h) = $1.71 \times 10 - {}^3M_v.712$ | (h) = 0.06 |

Preparation of Dried Nanoscale and Angstrom Scale Particles:

The method of washing residual release coating from the flake after it is removed from the drum or carrier is as follows. Using a Buchner Funnel with a 4,000 Ml. capacity and a side outlet for vacuum filtering and a filter such as a Whatman microfiber filter both available from Fisher Scientific. First add flake to the funnel with the filter in place and the vacuum on. Wash the flake by rinsing with the appropriate solvent. The solvent used may be Acetone, Ethyl Acetate or an Alcohol depending on the solubility of the release coat. The flake should be washed until the residual release coat is removed or reduced to the desired level. The filtered material may then be baked to eliminate volatile materials. This filter cake may also be annealed by baking at a higher temperature. The spent solvent may be distilled to be reclaimed and reused. The still bottoms may be reclaimed and reused in the release coating as mentioned previously. In production, larger vacuum filtering devices are available.

Barrier Materials

Experiments were run to determine the effect of flake size, pigment-to-binder ratio and coat weight on the moisture vapor transmission rate (MVTR) and oxygen permeability of flake-containing films. Large flake size was 20 microns and small flake size was 12 microns.

MVTR test data were as follows:

| Flake Size | P.B. | Coat Weight (g/m²) | MVTR/ (g/m²-day) |
|---|---|---|---|
| Large | 3:1 | 3.14 | 4.86 |
| Large | 1:1 | 3.62 | 5.85 |
| Small | 3:1 | 3.18 | 1.82 |
| Small | 3:1 | 0.8 | 8.86 |
| Large | 3:1 | 0.74 | 15.0 |
| Large | 3:1 | 3.14 | 4.86 |
| Large | 3:1 | 3.14 | 4.86 |
| Small | 3:1 | 3.18 | 1.82 |
| Large | 1:1 | 3.62 | 5.85 |
| Large | 1:1 | 1.38 | 11.90 |
| Clear Vehicle | | 1.08 | 74.4 |
| Dartek SF - 502 Nylon Film | | | 58.3 |

Pigment: Aluminum Flakes
Binder: Cellulose ink vehicle

Further test data revealed an MVTR of 1.2 for small particles, a 5:1 pigment-to-binder ratio and a coat weight of 5 gm/m².

The data show that additions of properly selected flakes can have a dramatic effect on MVTR. For example, the table shows a decrease of the MVTR of a nylon film from 75 g/m²-day to 1.8 g/m²-day with the best conditions being high P:B, small particle size (such as the angstrom scale flakes of this invention) and high coat weight. The further test data shows even better results.

Based on these data, applications for angstrom scale particles (thickness of less than about 100 angstroms and particles size of less than about 20 microns) for example, may include moisture transmission barrier materials. In use, the flakes line up in parallel in an essentially common plane and produce barriers to water molecules passing through the flake-containing film. Flakes, such as glass flakes, for example, can be used in polymeric films such as PVC, to inhibit plasticizer migration.

Electrical Applications

By running the release-coated carrier at a high rate of speed, deposited metal such as aluminum will produce discrete islands (nano-particles described above). These particles (when removed from the release layer) can be blended in a flake containing film, or used as-is in a polymeric film. The nano-particle containing film can increase electrical capacitance. Capacitance is proportional to dielectric constant and area and inversely proportioned to the separation distance between the capacitor plates. Nano-particles dispersed between larger particle size flakes raise the dielectric constant and therefore the capacitance.

Other uses of nanoparticles are described in Handbook of Deposition Technologies for Films and Coatings, "Nucleation, Film Growth, and Microstructural Evolution," Joseph Green, Noyes Publication (1994).

What is claimed is:

1. A process for making nanoscale flakes comprising:
providing a vacuum deposition chamber containing a deposition surface;
providing a release coat source and a flake deposition source in the vacuum deposition chamber, each directed toward the deposition surface;
depositing on the deposition surface under vacuum in alternating layers a vaporized polymeric release coat layer from the release coat source and vapor deposited discrete islands of flake material from the flake deposition source to build up in sequence a multi-layer vapor deposit of flake material layers comprising discrete islands of the flake material separated by and deposited on corresponding intervening release coat layers;
the release coat layers comprising a polymeric material which was vaporized under vacuum to form a smooth continuous solvent soluble and dissolvable barrier layer and support surface on which each of the layers of flake material is formed; and
removing the multi-layer vapor deposit from the vacuum deposition chamber and separating it into nanoscale flake particles by treatment with a solvent which dissolves the release coat layers and yields flakes with smooth, flat surfaces which are essentially free of the release coat material.

2. The process according to claim 1 in which the flake layer comprises a vapor-deposited material selected from the group consisting of metal in elemental form, an inorganic material, and a non-metal.

3. The process according to claim 2 in which the non-metal comprises silicon monoxide, silicon dioxide or a polymeric material, in which the inorganic material is selected from the group consisting of magnesium fluoride, silicon monoxide, silicon dioxide, aluminum oxide, aluminum fluoride, indium tin oxide, titanium dioxide and zinc sulfide, and in which the metal is selected from the group consisting of aluminum, copper, silver, chromium, indium, nichrome, tin and zinc.

4. The process according to claim 1 in which the release coat material is selected from styrene or acrylic polymers or blends thereof.

5. The process according to claim 1 in which the flake layers are deposited to a flake (discrete island) thickness of less than about 100 nanometers.

6. The process according to claim 1 in which the release coat layer comprises a thermoplastic polymeric material.

7. The process according to claim 1 in which the release coat layer comprises a lightly cross-linked resinous material which is dissolvable in an organic solvent to yield the flakes which are essentially free of the release material.

8. The process according to claim 1 in which the release coat layers are dissolvable in an organic solvent.

9. A process for making flakes comprising:
providing a vacuum deposition chamber containing a deposition surface;
providing a release coat source and a flake deposition source in the vacuum deposition chamber, each directed toward the deposition surface;
depositing on the deposition surface under vacuum in alternating layers a vaporized polymeric release coat layer from the release coat source and a vapor deposited layer of flake material from the flake deposition source to build up in sequence a multi-layer vapor deposit of flake material layers separated by and deposited on corresponding intervening release coat layers;
the release coat layers comprising a polymeric material which was vaporized under vacuum to form a smooth continuous solvent soluble and dissolvable barrier layer and support surface on which each of the layers of flake material is formed;
in which the release coat source comprises a wire feed mechanism in which the polymeric release coat material is coated onto a wire fed to the vacuum chamber and evaporated under heat therein to be deposited as said release coat layer; and
removing the multi-layer vapor deposit from the vacuum chamber deposition and separating it into flakes by treatment with a solvent which dissolves the release coat layers and yields flakes with smooth, flat surfaces which are essentially free of the release coat material.

10. The process according to claim 9 in which the release coat material is selected from styrene or acrylic polymers or blends thereof.

11. The process according to claim 9 in which the wire feed mechanism delivers the coated release coat material to a heater block positioned adjacent the deposition surface for evaporating the release coat material.

* * * * *